US006737852B2

(12) United States Patent
Soma et al.

(10) Patent No.: US 6,737,852 B2
(45) Date of Patent: May 18, 2004

(54) CLOCK SKEW MEASURING APPARATUS AND METHOD

(75) Inventors: Mani Soma, Seattle, WA (US); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 175 days.

(21) Appl. No.: 10/033,188

(22) Filed: Oct. 25, 2001

(65) Prior Publication Data

US 2003/0094937 A1 May 22, 2003

(51) Int. Cl.[7] .................. G01R 23/02; G01R 29/02; G01R 20/20
(52) U.S. Cl. .................. 324/76.74; 324/73.1; 702/79; 714/700
(58) Field of Search ............. 324/76.39, 73.1, 324/76.82, 76.52, 76.53, 76.74, 76.77, 76.58; 702/69, 72, 79; 327/144; 716/1–6; 713/400; 714/700

(56) References Cited

U.S. PATENT DOCUMENTS

| | | | | |
|---|---|---|---|---|
| 4,412,299 A | * | 10/1983 | Huffman | 702/72 |
| 4,805,195 A | * | 2/1989 | Keegan | 375/354 |
| 4,833,397 A | * | 5/1989 | McMurray, Jr. | 324/73.1 |
| 4,896,271 A | * | 1/1990 | Jenq et al. | 702/72 |
| 5,578,938 A | * | 11/1996 | Kazami | 326/16 |
| 6,522,122 B2 | * | 2/2003 | Watanabe et al. | 324/76.77 |
| 6,528,982 B1 | * | 3/2003 | Yanagisawa et al. | 324/76.77 |
| 6,594,595 B2 | * | 7/2003 | Yamaguchi et al. | 702/69 |

FOREIGN PATENT DOCUMENTS

| | | | |
|---|---|---|---|
| JP | 4-340485 | 11/1992 | G01R/31/28 |
| JP | 5-158575 | 6/1993 | G06F/1/04 |
| JP | 6-149408 | 5/1994 | G06F/1/10 |
| JP | 7-38590 | 2/1995 | H04L/12/40 |
| JP | 8-15380 | 1/1996 | G01R/31/28 |
| JP | 11-135920 | 5/1999 | H05K/3/22 |
| JP | U3067850 | 1/2000 | G01R/31/316 |
| JP | P2000-35831 A | 2/2000 | G06F/1/10 |
| JP | P2000-89844 A | 3/2000 | G06F/1/10 |
| JP | P2000-91506 A | 3/2000 | H01L/27/04 |
| JP | 2000-235063 | 8/2000 | G01R/31/316 |
| JP | P2001-228213 A | 8/2001 | G01R/31/28 |

OTHER PUBLICATIONS

International Search Report dated Feb. 4, 2003, 3 pages.
Wavecrest Corp., "Jitter Analysis Clock Solutions,", 1998, 16 pages.

* cited by examiner

Primary Examiner—Anjan K. Deb
(74) Attorney, Agent, or Firm—Osha Novak & May L.L.P.

(57) ABSTRACT

A clock skew measuring apparatus for measuring a clock skew between a plurality of clock signals to be measured in a device under test, includes: a clock signal selecting element for receiving clock signals and outputting them by selecting one of the clock signals one by one; and a clock skew estimator for receiving a reference signal input to the device under test and the clock signals to be measured selected by the clock signal selecting element one by one and for obtaining the clock skew between the clock signals to be measured.

21 Claims, 31 Drawing Sheets

CLOCK SKEW MEASURING APPARATUS AND METHOD

BACKGROUND OF THE INVENTION

1. Field of the Invention

The present invention relates to a clock skew measuring apparatus and a clock skew measuring method for measuring skews between a plurality of on-chip clock signals obtained by distribution by a clock distribution circuit on a semiconductor integrated circuit chip.

2. Description of the Related Art

According to conventional techniques, an on-chip clock skew is statistically estimated by bringing out clock signals to be measured into the outside of a chip at the same time, as shown in FIG. 1, using a time interval analyzer or frequency counter. The time interval analyzer measures a timing difference of a zero-crossing point between the clock signal to be measured and a reference clock signal so as to measure fluctuation thereof in accordance with histogram analysis. An exemplary clock skew measuring technique using the time interval analyzer is disclosed in Wavecrest Corp., Jitter Analysis Clock Solutions, 1998, for example.

The conventional clock skew measuring method, however, requires a plurality of high-frequency clock output pins that may increase a cost of the apparatus, in order to simultaneously bring out a plurality of clock signals to be measured to the outside of the chip, thereby increasing the cost of the measurement. Moreover, the number of pins of the chip is limited. Thus, in a large-scale semiconductor integrated circuit, the skew measurement is possible only for a very small number of the distributed clocks, so that the clock skew for the entire circuit cannot be obtained precisely. Therefore, a new clock skew measuring method is required in order to enable the high-precision control of the skews between the on-chip clock signals.

It is an object of the present invention to provide a clock skew measuring apparatus and a clock skew measuring method which can efficiently estimate the skews between the on-chip clock signals.

SUMMARY OF THE INVENTION

Therefore, it is an object of the present invention to provide clock skew measuring apparatus and method which overcomes the above issues in the related art. This object is achieved by combinations described in the independent claims. The dependent claims define further advantageous and exemplary combinations of the present invention.

According to the first aspect of the present invention, a clock skew measuring apparatus for measuring a clock skew between a plurality of clock signals to be measured in a device under test, comprises: a clock signal selecting element operable to receive the plurality of clock signals to be measured and to output the plurality of clock signals to be measured by selecting one of the plurality of clock signals to be measured one by one; and a clock skew estimator operable to receive a reference signal input to the device under test and the plurality of clock signals to be measured output from the clock signal selecting element and to obtain the clock skew estimates between the plurality of clock signals to be measured by measuring a timing difference between the received reference signal and each of the plurality of clock signals to be measured.

The clock skew measuring apparatus may further comprise: a plurality of buffers operable to respectively supply the plurality of clock signals to be measured to the clock signal selecting element; and a controller operable to control whether or not each of the plurality of buffers supplies a corresponding one of the plurality of clock signals to be measured to the clock signal selecting element.

The clock skew estimator may measure a deterministic component of the clock skew between the plurality of clock signals to be measured.

The clock skew estimator may measure a random component of the clock skew between the plurality of clock signals to be measured.

The clock skew estimator may include: a timing estimator operable to obtain a reference timing that is an edge timing of the reference signal and a tested timing that is an edge timing of each of the plurality of clock signals to be measured; a timing error estimator operable to obtain the timing difference between the tested timing and the reference timing; and a clock skew calculator operable to obtain the clock skew estimates between the plurality of clock signals to be measured from the timing difference obtained for each of the plurality of clock signals to be measured.

The clock skew estimator may further include a corrector operable to correct the clock skew obtained by the clock skew calculator.

The timing estimator may obtain a rising edge timing or a falling edge timing of each of the reference signal and the plurality of clock signals to be measured.

The timing estimator may include: an analytic signal transformer operable to transform each of the plurality of clock signals to be measured into a complex analytic signal; an instantaneous phase estimator operable to obtain an instantaneous phase of the analytic signal; a linear instantaneous phase estimator operable to obtain a linear instantaneous phase of each of the plurality of clock signals to be measured based on the instantaneous phase obtained; and an initial phase estimator operable to obtain an ideal edge timing of each of the plurality of clock signals to be measured by obtaining an initial phase angle of the linear instantaneous phase.

The timing estimator may further include: a linear trend remover operable to remove the linear instantaneous phase from the instantaneous phase to obtain an instantaneous phase noise; and a zero-crossing resampler operable to re-sample only data of the instantaneous phase noise around zero-crossing timings of a real part of the analytic signal and to output a timing jitter sequence of each of the plurality of clock signals to be measured.

The analytic signal transformer may include: a band-pass filter operable to receive each of the plurality of clock signals and to extract from the received clock signal frequency components around a fundamental frequency of the received clock signal thereby outputting a band-limited signal; and a Hilbert transformer operable to perform Hilbert transformation for the band-limited signal to generate Hilbert transform pairs of the clock signal to be measured.

The analytic signal transformer may include: a time-domain to frequency-domain transformer operable to receive each of the clock signals to be measured and to transform the received clock signal into two-sided spectra in a frequency domain; a bandwidth limiter operable to extract from the two-sided spectra frequency components around a positive fundamental frequency thereof; and a frequency-domain to time-domain transformer operable to inversely transform an output of the bandwidth limiter into a time-domain signal.

The analytic signal transformer may include: a buffer memory, to which each of the plurality of clock signals to be measured is supplied, operable to store the supplied clock signal; an extracting portion operable to select and extract a section of the stored clock signal in such a manner that a section presently extracted partially overlaps a section previously extracted; a window function multiplier operable to multiply the extracted section by a window function; a transforming portion operable to transform the multiplied section into two-sided spectra in a frequency domain; a bandwidth limiter operable to extract, from the two-sided spectra transformed in the frequency domain, frequency components around a positive fundamental frequency of the supplied clock signal to be measured; an inverse transformer operable to inversely transforming an output of the bandwidth limiter into a time-domain signal; and an inverse window function multiplier operable to multiply the time-domain signal by an inverse of the window function to obtain the analytic signal that has been band-limited.

The clock skew estimator may include an analog-to-digital converter operable to receive the reference signal and each of the clock signals to be measured and to digitize the reference signal and each of the clock signals to be measured.

The clock skew estimator may include a waveform clipper operable to receive the reference signal and each of the clock signals to be measured and to remove amplitude modulation components of the received clock signal to be measured to extract phase modulation components of the received clock signal.

The analytic signal transformer may be operable to be arranged to have a variable passband of each of the plurality of clock signals to be measured.

The timing estimator may further include a low-frequency component remover operable to receive the instantaneous phase noise and to remove low frequency components of the instantaneous phase noise to output the instantaneous phase noise, from which the low frequency components have been removed, to the zero-crossing resampler.

According to the second aspect of the present invention, a clock skew measuring method for measuring a clock skew between a plurality of clock signals to be measured in a device under test, comprises: outputting the plurality of clock signals to be measured by selecting one of the plurality of clock signals to be measured one by one; and obtaining the clock skew estimates between the plurality of clock signals to be measured by measuring a timing difference between reference signal input to the device under test and each of the plurality of clock signals to be measured one by one.

The reference signal may be a system clock signal supplied to the device under test.

The outputting and selecting step may include determining which one of the plurality of clock signals is to be selected based on the reference signal.

The clock skew estimating step may measure a deterministic component of the clock skew between the plurality of clock signals to be measured.

The clock skew estimating step may measure a random component of the clock skew between the plurality of clock signals to be measured.

The clock skew estimating step may include: obtaining an edge timing of the reference signal as a reference timing; obtaining an edge timing of each of the plurality of clock signals to be measured as a tested timing; obtaining the timing difference between the tested timing and the reference timing; and obtaining the clock skew estimates between the plurality of clock signals to be measured from the timing difference obtained for each of the plurality of clock signals to be measured.

The clock skew obtaining step may further include correcting the clock skew obtained from the timing difference.

The obtaining of edge timing may obtain a rising edge timing or a falling edge timing of each of the reference signal and the plurality of clock signals to be measured.

The timing estimating may include: transforming each of the plurality of clock signals to be measured into a complex analytic signal; obtaining an instantaneous phase of the analytic signal; obtaining a linear instantaneous phase of each of the plurality of clock signals to be measured based on the instantaneous phase obtained; and obtaining an ideal edge timing of each of the plurality of clock signals to be measured by obtaining an initial phase angle of the linear instantaneous phase.

The obtaining of edge timing may include: removing the linear instantaneous phase from the instantaneous phase to obtain an instantaneous phase noise; and re-sampling only data of the instantaneous phase noise around zero-crossing timings of a real part of the analytic signal to output a timing jitter sequence of each of the plurality of clock signals to be measured.

The transformation into the complex analytic signal may include: extracting, from each of the plurality of clock signals to be measured, frequency components around a fundamental frequency of the clock signal to output a band-limited signal; and performing Hilbert transformation for the band-limited signal to generate Hilbert transform pairs of the clock signal.

The transformation into the complex analytic signal may include: transforming each of the plurality of clock signals to be measured into two-sided spectra in a frequency domain; extracting, from the two-sided spectra, frequency components around a positive fundamental frequency thereof; and inversely transforming the two-sided spectra that has been band-limited into a time-domain signal.

The transformation into the complex analytic signal may include: storing each of the clock signals to be measured; selecting and extracting a section of the stored clock signal in such a manner that a section presently extracted partially overlaps a section previously extracted; multiplying the extracted section by a window function; transforming the multiplied section into two-sided spectra in a frequency domain; extracting, from the two-sided spectra transformed in the frequency domain, frequency components around a positive fundamental frequency of the stored clock signal to be measured; inversely transforming the spectra that has been band-limited into a time-domain signal; and multiplying the time-domain signal by an inverse of the window function to obtain the analytic signal that has been band-limited.

The obtaining of the timing difference between the tested timing and the reference timing may include: calculating a plurality of timing differences from the tested timing and the reference timing for each of the plurality of clock signals; and obtaining the mean value of the plurality of timing differences, and wherein the clock skew obtaining obtains the clock skew between the plurality of clock signals to be measured based on the average of the plurality of timing differences.

The clock skew obtaining may remove amplitude modulation components from the reference signal and each of the plurality of clock signals to be measured to extract phase modulation components thereof.

The obtaining of the edge timing further may include removing low frequency components of the instantaneous phase noise.

This summary of the invention does not necessarily describe all necessary features of the present invention so that the invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Clock Skew Measuring Method (1)

Figure 1:
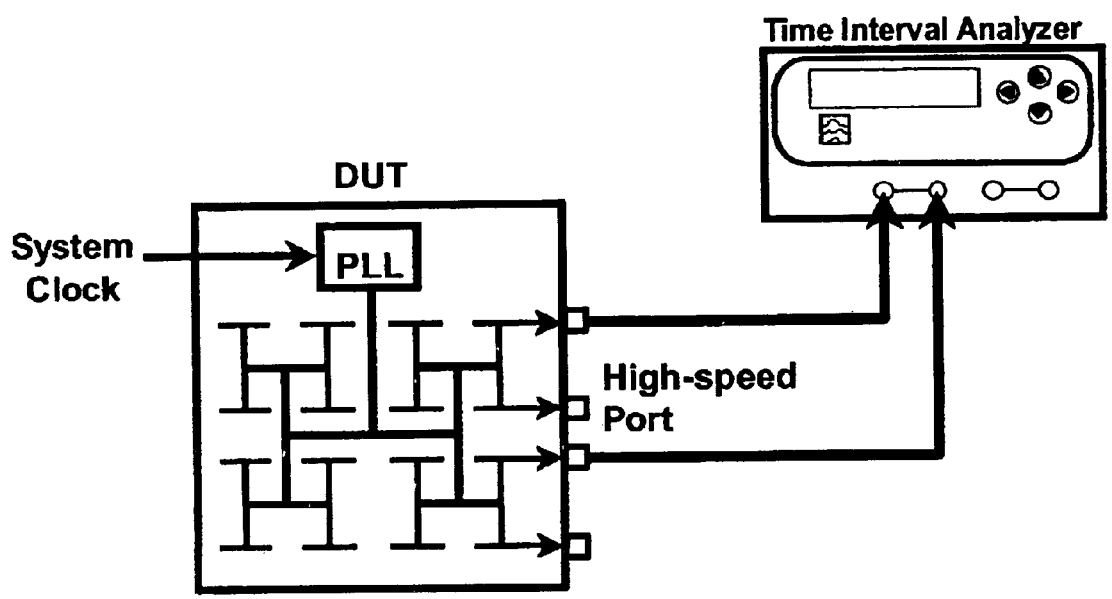
FIG. 1 illustrates an exemplary clock skew measurement using a time interval analyzer.
Figure 2A:
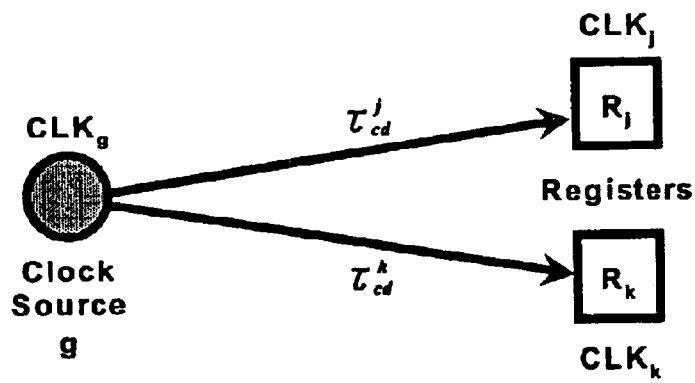
FIG. 2A schematically shows a clock distribution network.

First, clock skew is defined. With a clock source $CLK_g$ of a clock distribution network as a reference, as shown in FIG. 2A, the clock skew is given as a difference between $\tau^j_{cd}$ and $\tau^k_{cd}$ where $\tau^j_{cd}$ and $\tau^k_{cd}$ are delay times of distributed clock signals $CLK_j$ and $CLK_k$ required for reaching corresponding registers $R_j$ and $R_k$.

$$T_{Skew}^{j,k} = \tau_{cd}^k - \tau_{cd}^j \quad (1)$$

Figure 2B:
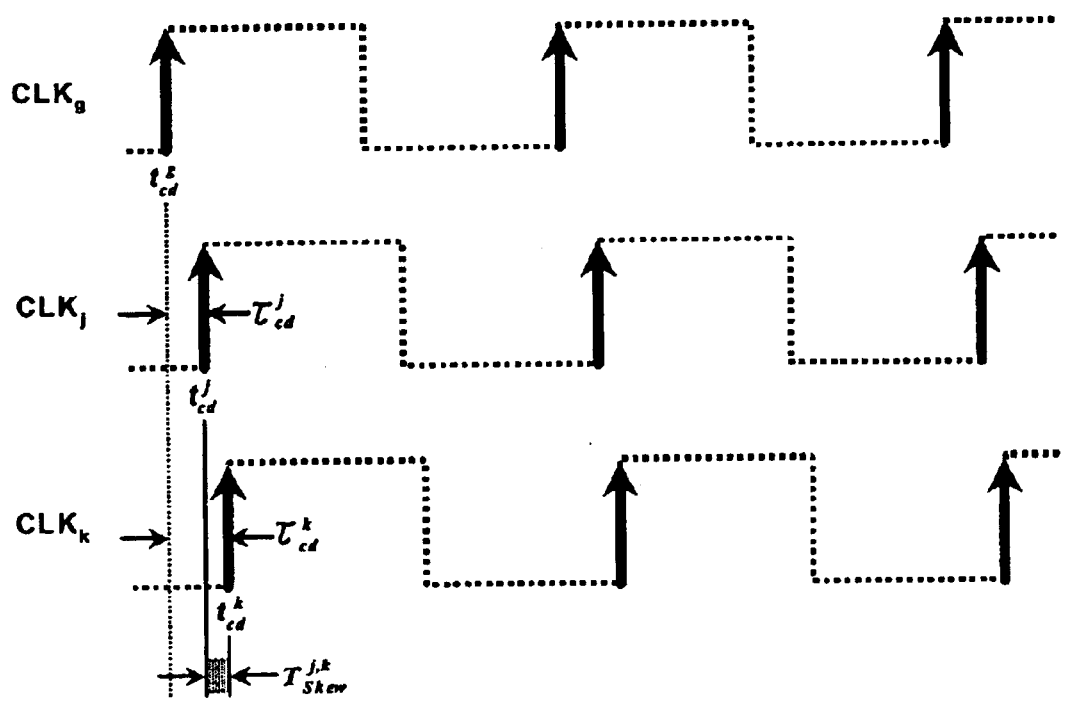
FIG. 2B schematically shows timing analysis for clock skew.

FIG. 2B shows a timing of the clock skew.

The delay times $\tau_{cd}^j$ and $\tau_{cd}^k$ are respectively represented as follows:

$$\tau_{cd}^j = t_{cd}^j - t_{cd}^g \quad (2)$$

$$\tau_{cd}^k = t_{cd}^k - t_{cd}^g \quad (3)$$

where rising edge timings of the clock signals $CLK_g$, $CLK_j$ and $CLK_k$ are $t_{cd}^g$, $t_{cd}^j$ and $t_{cd}^k$, respectively. As is apparent from those, the clock skew $T_{Skew}^{j,k}$ between the distributed clock signals $CLK_j$ and $CLK_k$ can be obtained from the time difference between the edge timing of each of the distributed clock signals $CLK_j$ and $CLK_k$ and the reference timing, where the edge timing of the clock source $CLK_g$ is the reference timing.

In the clock skew measuring method of the present embodiment, the distributed clocks to be measured are selected and brought out to the outside of the chip by means of a clock signal selector, for example, a multiplexer. Then, the time difference between the edge timing of the clock signal and the reference timing is measured for each of the selected clock signals, so that the difference between the time differences thus measured is obtained, thereby measuring the clock skew. For simplification, the method for measuring the skew between two distributed clock signals is described below.

Figure 3:
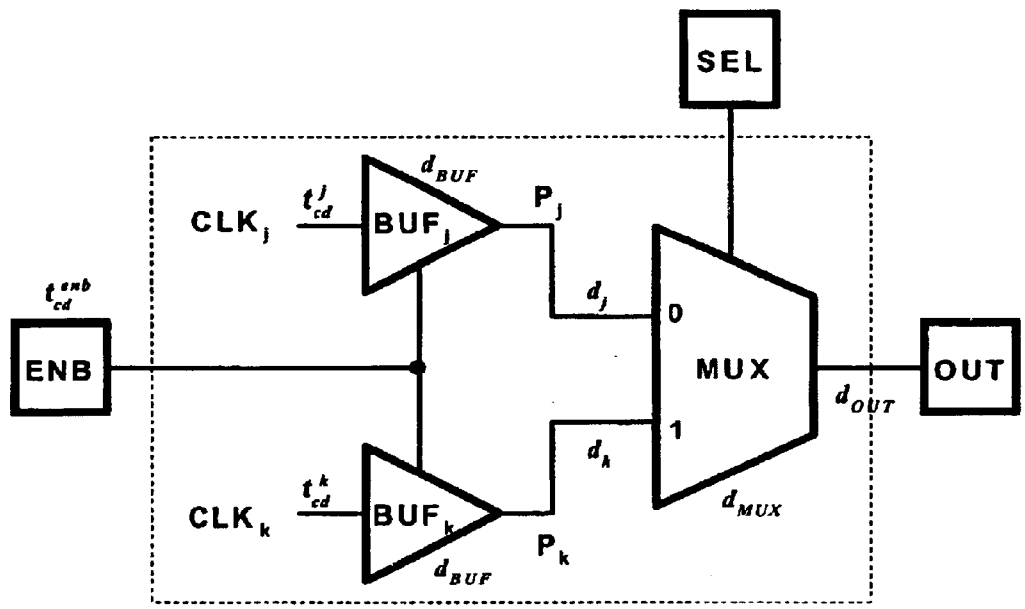
FIG. 3 shows an exemplary clock skew measurement circuit of the present invention.

FIG. 3 shows an exemplary clock skew measuring circuit of the present embodiment. The clock skew measuring circuit includes buffers for selecting and outputting the distributed clocks $CLK_j$ and $CLK_k$ to an output pin, and a multiplexer for selecting the distributed clock. The buffer can select whether or not the associated distributed clock is to be output to its output in accordance with an external input signal (ENB signal). The buffers $BUF_j$ and $BUF_k$ have identical design, and the transmission delay time in each buffer is assumed to be $d_{BUF}$. In addition, it is assumed that delay times of lines $P_j$ and $P_k$, the transmission delay time of the multiplexer, and the delay time from the clock signal selecting element to the output are $d_j$, $d_k$, $d_{MUX}$ and $d_{OUT}$, respectively.

The clock skew measuring method of the present embodiment uses the ENB signal that is synchronized with the edges of the clock source $CLK_g$ of the distributed clocks as the reference signal. Since the ENB signal is in synchronization with $CLK_g$, a time difference between an edge timing $t_{cd}^{enb}$ of the ENB signal and the rising edge timing $t_{cd}^g$ of $CLK_g$ is always constant.

$$t_{cd}^{enb} - t_{cd}^g = d_{const} \quad (4)$$

Next, a procedure of the clock skew measuring method of the present embodiment is described. First, the clock skew measuring method of the present embodiment sets a selection signal SEL for the multiplexer to zero to select $CLK_j$, thereby measuring a difference $D_j$ between the edge timing of the ENB signal and that of $CLK_j$ output to the output pin. $D_j$ is obtained as follows:

$$D_j = (t_{cd}^j + d_{BUF} + d_j + d_{MUX} + d_{OUT}) - t_{cd}^{enb} \quad (5)$$

where the rising edge timings of the ENB signal and $CLK_j$ are $t_{cd}^{enb}$ and $t_{cd}^j$, respectively.

Next, the selection signal SEL for the multiplexer is set to one so that $CLK_k$ is selected, and a difference $D_k$ between the edge timing of the ENB signal and that of $CLK_k$ output to the output pin. $D_k$ is obtained as follows:

$$D_k = (t_{cd}^k + d_{BUF} + d_k + d_{MUX} + d_{OUT}) - t_{cd}^{enb} \quad (6)$$

where the rising edge timings of the ENB signal and $CLK_k$ are $t_{cd}^{enb}$ and $t_{cd}^k$, respectively.

Finally, a difference between the thus measured differences $D_k$ and $D_j$.

$$D_k - D_j = \{(t_{cd}^k + d_{BUF} + d_k + d_{MUX} + d_{OUT}) - t_{cd}^{enb}\} - \{(t_{cd}^j + d_{BUF} + d_j + d_{MUX} + d_{OUT}) - t_{cd}^{enb}\}$$

When this equation is calculated by using Equation (4), $$D_k - D_j = \{(t_{cd}^k - t_{cd}^g) - (t_{cd}^j - t_{cd}^g)\} - (d_k - d_j)$$

is obtained. Using Equations (1), (2) and (3), the difference between $D_k$ and $D_j$ is obtained as follows.

$$D_k - D_j = (\tau_{cd}^k - \tau_{cd}^j) - (d_k - d_j) = T_{Skew}^{j,k} - (d_k - d_j) \quad (7)$$

Therefore, when the lines $P_j$ and $P_k$ that respectively connect the buffers to the multiplexer are laid out in such a manner that the delay times $d_j$ and $d_k$ are equal to each other, the clock skew between $CLK_j$ and $CLK_k$ can be obtained by obtaining the difference between $D_k$ and $D_j$ by using the clock skew measuring method of the present invention.

Moreover, if the delay times $d_j$ and $d_k$ are not equal to each other, the clock skew between $CLK_j$ and $CLK_k$ can be obtained by correcting the difference between $D_k$ and $D_j$.

$$T_{Skew}^{j,k} = (D_k - D_j) + (d_k - d_j) \quad (8)$$

Figure 4:
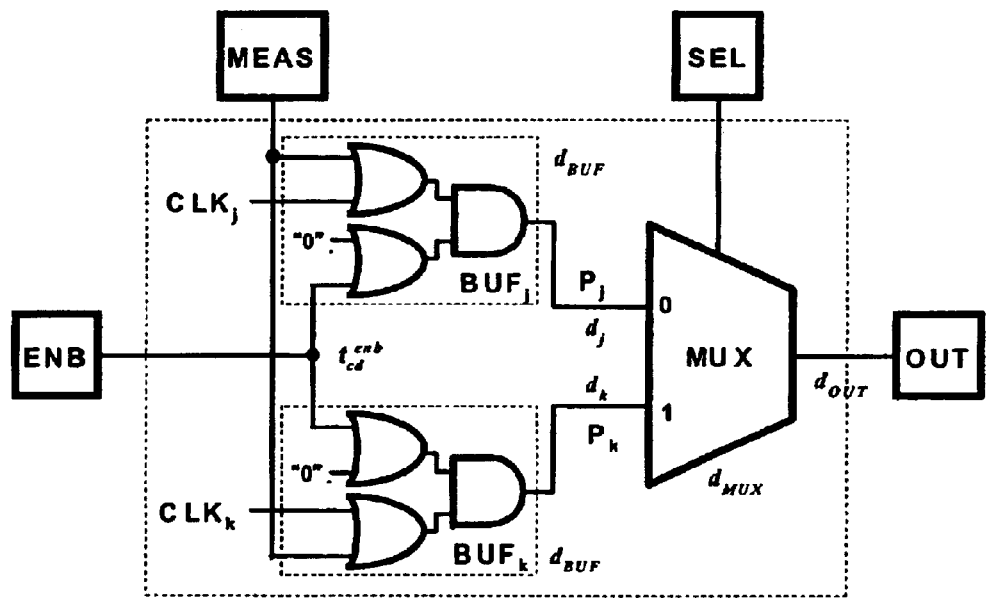
FIG. 4 shows another exemplary clock skew measurement circuit of the present invention.

In the above, the difference between $d_k$ and $d_j$ may be obtained by circuit simulation or actual measurement using, for example, a circuit shown in FIG. 4.

FIG. 4 shows a modification of the clock skew measuring circuit of the present embodiment. In FIG. 4, propagation delay times $D_j^{enb}$ and $D_k^{enb}$ that are times required for propagating the ENB signal until the output pin OUT via the lines $P_j$ and $P_k$, respectively, can be measured by supplying the ENB signal while the MEAS signal is set to one.

$$D_j^{enb} = (t_{cd}^{enb} + d_{BUF} + d_j + d_{MUX} + d_{OUT}) - t_{cd}^{enb} = d_{BUF} + d_j + d_{MUX} + d_{OUT}$$

$$D_k^{enb} = (t_{cd}^{enb} + d_{BUF} + d_k + d_{MUX} + d_{OUT}) - t_{cd}^{enb} = d_{BUF} + d_k + d_{MUX} + d_{OUT}$$

The difference between $D_j^{enb}$ and $D_k^{enb}$ is obtained as follows.

$$D_k^{enb} - D_j^{enb} = d_k - d_j$$

Thus, the difference between $d_j$ and $d_k$ can be obtained by obtaining the transmission times $D_j^{enb}$ and $D_k^{enb}$ that are the times required for the transmission of the ENB signal to the output pin OUT via the lines $P_j$ and $P_k$ by using the circuit shown in FIG. 4, and then calculating the difference between the thus obtained propagation delay times $D_j^{enb}$ and $D_k^{enb}$.

Clock Skew Measuring Method (2)

Next, a clock skew measuring method using instantaneous phase estimation by an analytic signal is described. This method can obtain a deterministic component and a random component of the clock skew.

Figure 5A:
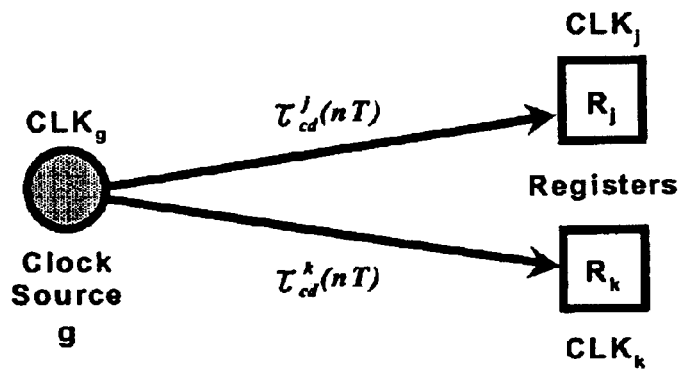
FIG. 5A schematically shows a clock distribution network.

First, the clock skew between the clock signals having jitter is defined. When the clock source $CLK_g$ of the clock distribution network is assumed to be the reference, for example, as shown in FIG. 5A, the clock skew is given as the difference between the delay times $\tau_{cd}^j$ and $\tau_{cd}^k$ that are the times required for the propagation delay of the distributed clock signals $CLK_j$ and $CLK_k$ to reach the corresponding registers $R_j$ and $R_k$. Since the rising edge timing of each clock signal is varied for each cycle due to the jitter, the clock skew of each cycle, $T_{Skew}^{j,k}(nT)$, is expressed as follows.

$$T_{Skew}^{j,k}(nT) = \tau_{cd}^k(nT) - \tau_{cd}^j(nT) \quad (9)$$

Figure 5B:
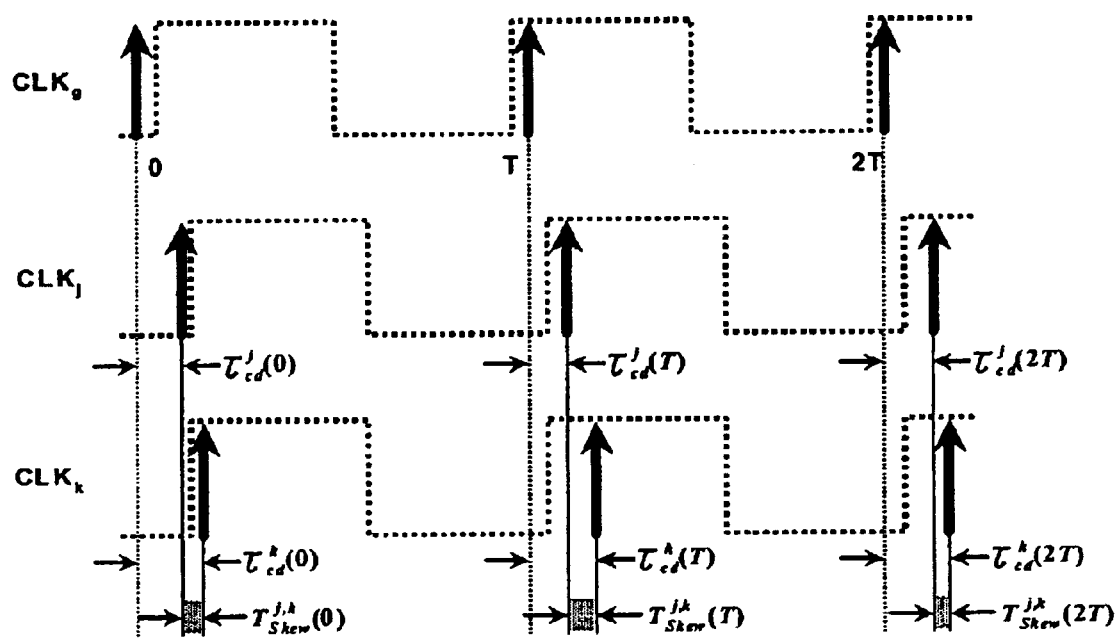
FIG. 5B schematically shows timing analysis for clock skew.

FIG. 5B shows the timings of the clock skew. In this description and FIG. 5B, T is a fundamental period of the clock signal to be measured.

The rising edge timings of the clock signals $CLK_g$, $CLK_j$ and $CLK_k$ are assumed to be $t_{cd}^g$, $t_{cd}^j$ and $t_{cd}^k$, respectively. When ideal clock edge timings of the clock signals $CLK_g$, $CLK_j$ and $CLK_k$ (i.e., the clock edge timings of the clock signals with no jitter) are assumed to be $(nT)_g$, $(nT)_j$ and $(nT)_k$, respectively, the delay times of each cycle $\tau_{cd}^j(nT)$ and $\tau_{cd}^k(nT)$ are respectively expressed as follows.

$$\tau_{cd}^j(nT) = t_{cd}^j(nT) - t_{cd}^g(nT) \quad (10)$$

$$= [t_{cd}^j(nT) - (nT)_j] - [t_{cd}^g(nT) - (nT)_g] + \{(nT)_j - (nT)_g\}$$

$$= \tau_{delay}^{g,j} + \left[\Delta\phi^j[n]\left(\frac{T_j}{2\pi}\right) - \Delta\phi^g[n]\left(\frac{T_g}{2\pi}\right)\right][\sec]$$

$$\tau_{cd}^k(nT) = t_{cd}^k(nT) - t_{cd}^g(nT) \quad (11)$$

$$= [t_{cd}^k(nT) - (nT)_k] - [t_{cd}^g(nT) - (nT)_g] + \{(nT)_k - (nT)_g\}$$

$$= \tau_{delay}^{g,k} + \left[\Delta\phi^k[n]\left(\frac{T_k}{2\pi}\right) - \Delta\phi^g[n]\left(\frac{T_g}{2\pi}\right)\right][\sec]$$

In the above expressions, $$\tau_{delay}^{g,j} = (nT)_j - (nT)_g \quad (12)$$

$$\tau_{delay}^{g,k} = (nT)_k - (nT)_g [\sec] \quad (13)$$

are respectively time differences between the ideal clock edge timings of the distributed clocks $CLK_j$ and $CLK_k$ and the ideal clock edge timing of the clock source $CLK_g$, and correspond to the deterministic components of the propagation delays that are defined by transmission paths (deterministic propagation delay times). Moreover, $\Delta\phi^g[n]$ ($T_g/2\pi$. $(=t_{cd}^g(nt)-(nT)_g)$, $\Delta\phi^j[n]$($T_j/2\pi$. $(=t_{cd}^j(nt)-(nT)_j)$ and $\Delta\phi^k[n]$($T_k/2\pi$. $(=t_{cd}^k(nt)-(nT)_k)$ respectively represent timing jitter sequence of the clocks $CLK_g$, $CLK_j$ and $CLK_k$ (unit is second). How to estimate the timing jitter of the clock signal will be described later. From Equations (9), (10) and (11), the clock skew $T_{Skew}^{j,k}[n]$ ($=T_{Skew}^{j,k}(nT)$) between $CLK_j$ and $CLK_k$ is estimated as follows.

$$T_{skew}^{j,k}[n] = \left\{\tau_{Skew}^{g,k} + \left[\Delta\phi^k[n]\left(\frac{T_g}{2\pi}\right) - \Delta\phi^g[n]\left(\frac{T_g}{2\pi}\right)\right]\right\} - \quad (14)$$

$$\left\{\tau_{Skew}^{g,j} + [\Delta\phi^j[n]]\left(\frac{T_j}{2\pi}\right) - \Delta\phi^g[n]\left(\frac{T_g}{2\pi}\right)\right\}[\sec] =$$

$$\tau_{Skew}^{j,k} + \left[\Delta\phi^k[n]\left(\frac{T_k}{2\pi}\right) - \Delta\phi^j[n]\left(\frac{T_j}{2\pi}\right)\right]$$

The first term of Equation (14)

$$\tau_{Skew}^{j,k} = (nT)_k - (nT)_j [\sec] \quad (15)$$

represents the difference of the rising edge timing between the ideal clocks of $CLK_j$ and $CLK_k$, and is an example of the deterministic component of the clock skew determined from the paths in the clock distribution network, for example. In addition, the second term of Equation (14)

$$\left[\Delta\phi^k[n]\left(\frac{T_k}{2\pi}\right) - \Delta\phi^j[n]\left(\frac{T_j}{2\pi}\right)\right]$$

is an example of the random component of the clock skew due to the timing jitter contained in the respective clock signals.

The deterministic clock skew value $\tau_{Skew}^{j,k}$ can be estimated by obtaining, for example, the instantaneous phases of two signals $CLK_j$ and $CLK_k$ and then obtaining the difference between linear phase components of the instantaneous phases of these two signals. The fundamental-frequency cosine components of $CLK_j$ and $CLK_k$ are assumed as follows.

$$x_j(t) = A_j \cos(\phi^j(t)) = A_j \cos\left(\frac{2\pi}{T_j}t + \phi_0^j - \Delta\phi^j(t)\right) \quad (16)$$

$$x_k(t) = A_k \cos(\phi^k(t)) = A_k \cos\left(\frac{2\pi}{T_k}t + \phi_0^k - \Delta\phi^k(t)\right) \quad (17)$$

Here, the instantaneous phases of $x_j(t)$ and $x_k(t)$ are represented as the sum of the linear instantaneous phase component $2\pi t/T_L$ containing the fundamental period $T_L$ (L=j, k), the initial phase angle $\phi_0^L$ (L=j, k), and the instantaneous phase noise component $\Delta\phi^L(t)$ (L=j, k).

$$\phi^j(t) = \frac{2\pi}{T_j}t + \phi_0^j - \Delta\phi^j(t) \text{ [rad]} \quad (18)$$

$$\phi^k(t) = \frac{2\pi}{T_k}t + \phi_0^k - \Delta\phi^k(t) \text{ [rad]} \quad (19)$$

The estimation method of the instantaneous phase of the clock signal will be described later. When $\Delta\phi(t)=0$ in Equations (18) and (19), the linear instantaneous phases of the clocks with no jitter $$\phi_{linear}^j(t) = \frac{2\pi}{T_j}t + \phi_0^j \text{ [rad]} \quad (20)$$

$$\phi_{linear}^k = (t) = \frac{2\pi}{T_k}t + \phi_0^k \text{ [rad]} \quad (21)$$

are obtained. In this case, the ideal rising edge timings of $CLK_j$ and $CLK_k$, $t=(nT)_j$, $(nT)_k$, are times at which the linear instantaneous phase components in left-hand side of Equations (18) and (19) become ($2n\pi-\pi/2$), respectively, and therefore the following relationships are satisfied.

$$(nT)_j = \left(2n\pi - \frac{\pi}{2} - \phi_0^j\right)\frac{T_j}{2\pi} [\sec] \quad (22)$$

$$(nT)_k = \left(2n\pi - \frac{\pi}{2} - \phi_0^k\right)\frac{T_k}{2\pi} \text{ [sec]} \quad (23)$$

Thus, from Equation (15), the deterministic clock skew value $$\tau_{Skew}^{jk} = \quad (24)$$

$$(nT)_k - (nT)_j = \left(2n\pi - \frac{\pi}{2} - \phi_0^k\right)\frac{T_k}{2\pi} - \left(2n\pi - \frac{\pi}{2} - \phi_0^j\right)\frac{T_j}{2\pi} \text{[sec]} =$$

$$\phi_0^j\left(\frac{T_j}{2\pi}\right) - \phi_0^k\left(\frac{T_k}{2\pi}\right) = (\phi_0^j - \phi_0^k)\frac{T_0}{2\pi}$$

is obtained. In general, the fundamental periods of the distributed clock signals $CLK_j$ and $CLK_k$ are equal to each other ($T_j=T_k$). That is, the deterministic clock skew value between the two signals to be measured can be obtained as the difference of the initial phase angle in the linear instantaneous phase between the two signals to be measured.

The initial phase angle $\phi_0$ can be obtained by performing a least-square fit of a to the instantaneous phase data $\phi(k)$ and then determining $\hat{\phi}_0$ that makes $$\sum_{k=1}^{N}\left(\phi(k) - (\hat{\omega}_0 k + \hat{\phi}_0)\right)^2 \quad (25)$$

be minimum. At this time, the initial phase angle is given as follows.

$$\hat{\phi}_0 = \frac{2(2N+1)\sum_{k=1}^{N}\phi(k) - 6\sum_{k=1}^{N}k\phi(k)}{N(N-1)} \quad (26)$$

Moreover, the initial phase angle $\phi_0$ of the signal to be measured $x(t)$ can be obtained by performing cosine wave fitting using the least-squares method for the clock waveform data $x(k)$ or its fundamental sine component and then estimating $\hat{\phi}_0$ that makes $$\sum_{k=1}^{N}\left(x(k) - A\cos\left(\frac{2\pi}{T}k + \hat{\phi}_0\right)\right)^2 \quad (27)$$

be maximum in accordance with a maximum likelihood estimation method. In this case, the initial phase angle is given by the following expression.

$$\hat{\phi}_0 = -\arctan\left(\frac{\sum_{k=1}^{N}x(k)\sin\frac{2\pi}{T}k}{\sum_{k=1}^{N}x(k)\cos\frac{2\pi}{T}k}\right) \quad (28)$$

In the above, it is assumed that the corresponding clock edges of the two signals to be measured are not separated by one period or more. On the other hand, in a case where the corresponding clock edges are away from each other by one period or more, the deterministic clock skew value can be obtained as the sum of the difference of the initial phase angle and the offset time of the clock edges.

$$\tau_{Skew}^{j,k} = (\phi_0^j - \phi_0^k)\frac{T_0}{2\pi} + n_{offset}T_0 \text{ [sec]} \quad (29)$$

Figure 6A:
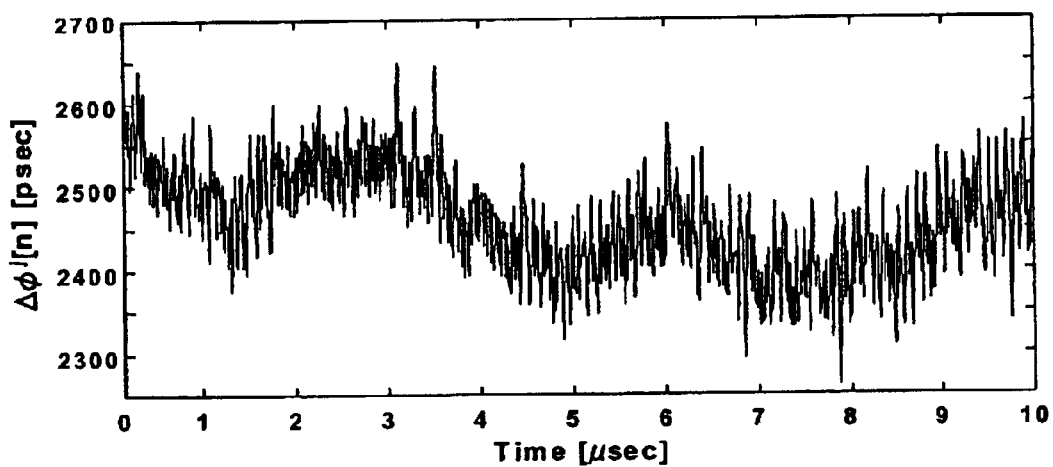
FIG. 6A shows exemplary timing jitter $\Delta\phi^j[n]$ of a clock $CLK_j$ to be measured.
Figure 6B:
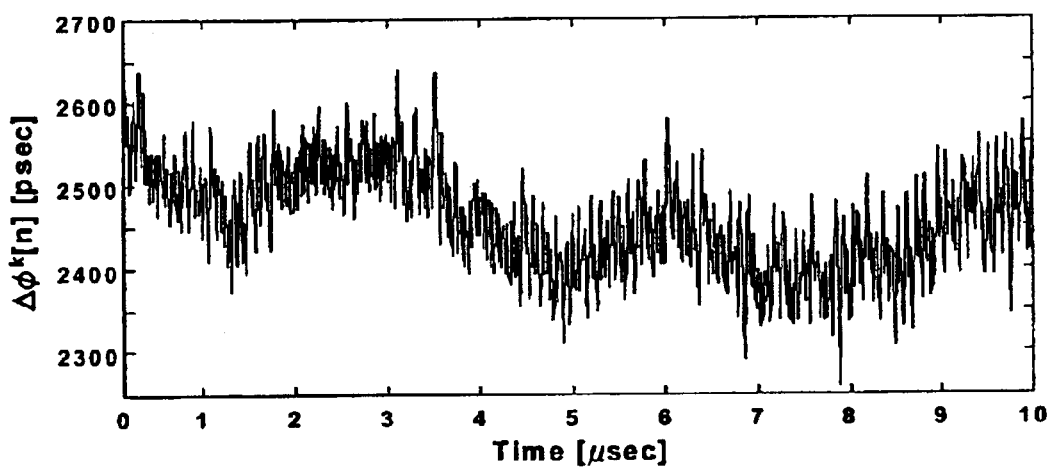
FIG. 6B shows exemplary timing jitter sequence $\Delta\phi^k[n]$ of a clock $CLK_k$ to be measured.

The clock signal obtained by distribution from the clock source has a strong relationship with the clock signal of the clock source. As a result of this, the phase noise of the distributed clock signal (timing jitter sequence) generally has a similar tendency to that of the phase noise of the clock source (timing jitter sequence). Thus, the timing jitter sequence of the distributed clock signals obtained by distribution from the same clock source have the same tendency (see FIGS. 6A and 6B). Therefore, the offset amount $n_{offset}$ of the corresponding clock edges of the two signals to be measured can be estimated by obtaining correlation between the timing jitter sequence thereof and then finding a value of the offset that provides the maximum correlation. Also, the offset amount $n_{offset}$ may be obtained from the value of offset that provides the maximum correlation of the instantaneous phase noises.

Moreover, the deterministic clock skew value may be obtained by obtaining zero-crossing times of the signals to be measured and then calculating an average value of the time differences between the corresponding zero-crossing times.

Figure 7:
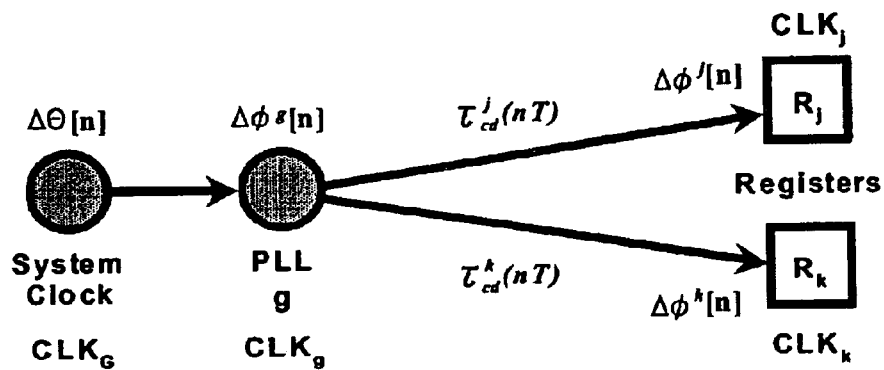
FIG. 7 schematically shows a clock distribution network with different clock domains.
Figure 8:
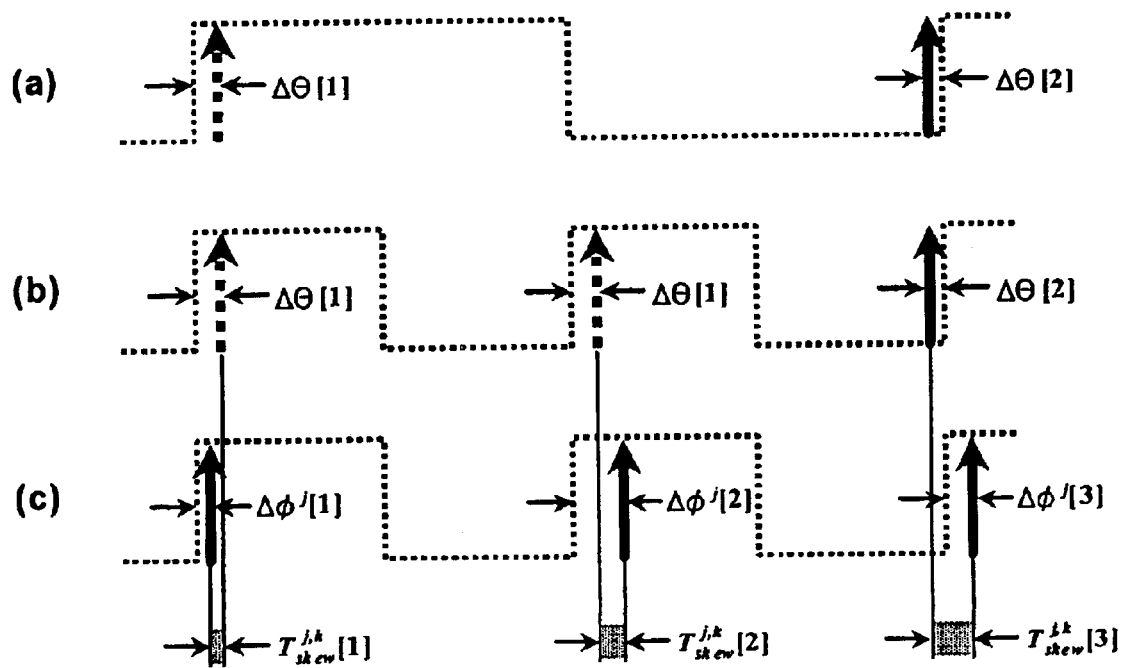
FIG. 8 schematically shows a principle of clock skew measurement using frequency multiplication by modulo M: M=2.

Next, the clock skew between the clock signals having different frequencies is described. In this description, the clock distribution network shown in FIG. 7 is considered. A clock source $PLL_g$ multiplies a system clock $CLK_G$ that is supplied from the outside, by M, and then distributes the clocks $CLK_j$ and $CLK_k$ to the network. In FIG. 8, (a) shows the system clock $CLK_G$ while (c) shows the clock $CLK_j$ obtained by multiplication. $\Delta\Theta[1][\text{rad}]$ of the system clock $CLK_G$ represents timing fluctuation with respect to the ideal clock edge of that edge. Therefore, when edges of the ideal clock obtained by multiplication by M are considered, as shown in FIG. 8(*b*), and then $\Delta\Theta[1]$ is copied to obtain (M−1) copies, $\Delta\Theta[\lfloor n/M \rfloor]$ corresponds to $\Delta\phi^j[n]$ one by one. Please note that $\lfloor x \rfloor$ represents largest integer less than or equal to x. When the clock skew between $CLK_j$ and $CLK_G$ is obtained by using Equation (14), Equation (30) is obtained.

$$T_{Skew}^{G,j}[n] = \tau_{Skew}^{G,j} + \left[\Delta\phi^j[n]\left(\frac{T_j}{2\pi}\right) - \Delta\Theta\left[\left\lfloor\frac{n}{M}\right\rfloor\right]\left(\frac{T_G}{2\pi}\right)\right] \text{ [sec]} \quad (30)$$

The deterministic clock skew value $\tau_{Skew}^{Gj}$ between $CLK_j$ and $CLK_G$ is represented as the time difference between the ideal clock edge of $CLK_j$, $(nMT)_j$, and the ideal clock edge of the system clock $CLK_G$, $(nMT)_G$, and can be obtained from the initial phase angles of the respective clocks by the following equation.

$$\tau_{Skew}^{G,j} = \quad (31)$$

$$(nMT)_j - (nMT)_G = \phi_0^G\left(\frac{T_G}{2\pi}\right) - \phi_0^j\left(\frac{T_j}{2\pi}\right) = \phi_0^G\left(\frac{MT_0}{2\pi}\right) - \phi_0^j\left(\frac{T_0}{2\pi}\right) \text{[sec]}$$

Since the clock $CLK_j$ is obtained by multiplication of the system clock $CLK_G$ by M, the fundamental period of $CLK_G$, $T_G$, is equal to M times the fundamental period $T_j$ of $CLK_j$ ($T_G=MT_j$).

Next, a procedure for obtaining the clock skew between the distributed clocks $CLK_j$ and $CLK_g$ by using the reference clock signal $CLK_R$ is described.

First, only $CLK_j$ and $CLK_R$ are sampled simultaneously, and the skew between $CLK_j$ and $CLK_R$, $$T_{Skew}^{R,j}[n] = \tau_{Skew}^{R,j} + \left[\Delta\phi^j[n]\left(\frac{T_j}{2\pi}\right) - \Delta\phi^R[n]\left(\frac{T_R}{2\pi}\right)\right] \text{ [sec]} \quad (32)$$

is obtained by using Equation (14). Then, only $CLK_k$ and $CLK_R$ are simultaneously sampled, and the skew between $CLK_k$ and $CLK_R$, $$T_{Skew}^{R,k}[n] = \tau_{Skew}^{R,k} + \left[\Delta\phi^k[n]\left(\frac{T_k}{2\pi}\right) - \Delta\phi^R[n]\left(\frac{T_R}{2\pi}\right)\right] \text{ [sec]} \quad (33)$$

is obtained. Finally, by obtaining the difference between the clock skew sequence obtained as mentioned above, the clock skew between $CLK_j$ and $CLK_k$ is obtained as follows.

$$T_{Skew}^{j,k}[n] = \quad (34)$$

$$T_{Skew}^{R,k}[n] - T_{Skew}^{R,j}[n] = \left\{\tau_{Skew}^{R,k} + \left[\Delta\phi^k[n]\left(\frac{T_k}{2\pi}\right) - \Delta\phi^R[n]\left(\frac{T_R}{2\pi}\right)\right]\right\} -$$

$$\left\{\tau_{Skew}^{R,j} + \left[\Delta\phi^j[n]\left(\frac{T_j}{2\pi}\right) - \Delta\phi^R[n]\left(\frac{T_R}{2\pi}\right)\right]\right\} =$$

$$\left(\tau_{Skew}^{R,k} - \tau_{Skew}^{R,j}\right) + \left\{\left[\Delta\phi^k[n]\left(\frac{T_k}{2\pi}\right) - \Delta\phi^R[n]\left(\frac{T_R}{2\pi}\right)\right] -$$

$$\left[\Delta\phi^j[n]\left(\frac{T_j}{2\pi}\right) - \Delta\phi^R[n]\left(\frac{T_R}{2\pi}\right)\right]\right\} \text{ [sec]}$$

The above procedure can be applied to the clock signal shaving different frequencies. Thus, the clock skew measuring method of the present embodiment can measure the clock skew between the on-chip clock signals by using the system clock supplied to the semiconductor integrated circuit under test from the outside thereof as the reference clock signal.

The clock skew measuring method of the present embodiment performs simultaneous sampling for the distributed clock $CLK_j$ and the system clock $CLK_G$ and then obtains the skew between $CLK_j$ and $CLK_G$, $$T_{Skew}^{G,j}[n] = \tau_{Skew}^{G,j} + \left[\Delta\phi^j[n]\left(\frac{T_j}{2\pi}\right) - \Delta\Theta\left[\left\lfloor\frac{n}{M}\right\rfloor\right]\left(\frac{T_G}{2\pi}\right)\right] \text{ [sec]} \quad (35)$$

by using Equation (30). Next, the other distributed clock $CLK_k$ and the system clock $CLK_G$ are simultaneously sampled, and the skew between $CLK_k$ and $CLK_G$, $$T_{Skew}^{G,k}[n] = \tau_{Skew}^{G,k} + \left[\Delta\phi^k[n]\left(\frac{T_k}{2\pi}\right) - \Delta\Theta\left[\left\lfloor\frac{n}{M}\right\rfloor\right]\left(\frac{T_G}{2\pi}\right)\right] \text{ [sec]} \quad (36)$$

is then obtained similarly. Finally, by calculating the difference between the clock skew sequence obtained as mentioned above, the clock skew between $CLK_j$ and $CLK_k$, $$T_{Skew}^{j,k}[n] = \quad (37)$$

$$T_{Skew}^{G,k}[n] - T_{Skew}^{G,j}[n] = \left\{\tau_{Skew}^{G,k} + \left[\Delta\phi^k[n]\left(\frac{T_k}{2\pi}\right) - \Delta\Theta\left[\left\lfloor\frac{n}{M}\right\rfloor\right]\left(\frac{T_G}{2\pi}\right)\right]\right\} -$$

$$\left\{\tau_{Skew}^{G,j} + \left[\Delta\phi^j[n]\left(\frac{T_j}{2\pi}\right) - \Delta\Theta\left[\left\lfloor\frac{n}{M}\right\rfloor\right]\left(\frac{T_G}{2\pi}\right)\right]\right\} =$$

$$\left(\tau_{Skew}^{G,k} - \tau_{Skew}^{G,j}\right) + \left\{\left[\Delta\phi^k[n]\left(\frac{T_k}{2\pi}\right) - \Delta\Theta\left[\left\lfloor\frac{n}{M}\right\rfloor\right]\left(\frac{T_G}{2\pi}\right)\right] -$$

$$\left[\Delta\phi^j[n]\left(\frac{T_j}{2\pi}\right) - \Delta\Theta\left[\left\lfloor\frac{n}{M}\right\rfloor\right]\left(\frac{T_G}{2\pi}\right)\right]\right\} \text{ [sec]}$$

is estimated. In addition, as described in the description of the first clock skew measuring method, when the delay times $d_j$ and $d_k$ of the clock-output lines are not equal to each other, the clock skew between $CLK_j$ and $CLK_k$ can be obtained with high precision by obtaining the difference between $d_j$ and $d_k$ by simulation or the like and then correcting the clock skew obtained by Equation (37) by using the obtained difference between $d_j$ and $d_k$.

$$T_{Skew}^{j,k}[n] = \left(\tau_{Skew}^{G,k} - \tau_{Skew}^{G,j}\right) + \left\{\left[\Delta\phi^k[n]\left(\frac{T_k}{2\pi}\right) - \Delta\Theta\left[\left\lfloor\frac{n}{M}\right\rfloor\right]\left(\frac{T_G}{2\pi}\right)\right] - \quad (38)$$

$$\left[\Delta\phi^j[n]\left(\frac{T_j}{2\pi}\right) - \Delta\Theta\left[\left\lfloor\frac{n}{M}\right\rfloor\right]\left(\frac{T_G}{2\pi}\right)\right]\right\} + (d_k - d_j) \text{ [sec]}$$

As a result, according to the clock skew measuring method of the present embodiment, the measurement can be performed by selecting and making the on-chip clock signals distributed over the semiconductor chip output to the outside of the chip one by one. Thus, by adding the clock signal selecting element for selecting the clock signal and outputting it to the outside to the device under test, the number of high-frequency clock-output pins, that may increase the cost, can be greatly reduced. In the present embodiment, for example, the number of high-frequency clock-output pins can be reduced to be minimum. Therefore, the clock skew measuring method is suitable for analysis or test for VLSIs.

The clock skew measuring method of the present embodiment can estimate not only the clock skews between the distributed clock signals of MPU as described above but also the clock skews between other types of signals.

In the above description, a case where the output of the clock signal selecting element is one is described as an example. However, the present invention is not limited to the above case. The present invention can be applied to the clock skew measurement using the clock signal selecting element having two or more outputs.

Instantaneous Phase Estimation Using Analytic Signal

An analytic signal z(t) of a real signal x(t) is defined by the following complex signal.

$$z(t) \equiv x(t) + j\hat{x}(t) \quad (39)$$

In the above, j is an imaginary unit and the imaginary part $\hat{x}(t)$ of the complex signal z(t) is Hilbert transform of the real part x(t).

Hilbert transform of a time-variant waveform x(t) is defined as follows.

$$\hat{x}(t) = H[x(t)] = \frac{1}{\pi}\int_{-\infty}^{+\infty}\frac{x(\tau)}{t-\tau}d\tau \quad (40)$$

In the above, $\hat{x}(t)$ is convolution of functions x(t) and (1/πf). That is, Hilbert transform is equivalent to the output obtained when x(t) is made to pass through a full band-pass filter. However, the output $\hat{x}(t)$ has the spectra component but the phase shifted by π/2.

The instantaneous phase waveform φ(t) of the real signal x(t) can be obtained from the analytic signal z(t) by using the following equation.

$$\phi(t) = \tan^{-1}\left[\frac{\hat{x}(t)}{x(t)}\right] \quad (41)$$

Figure 9:
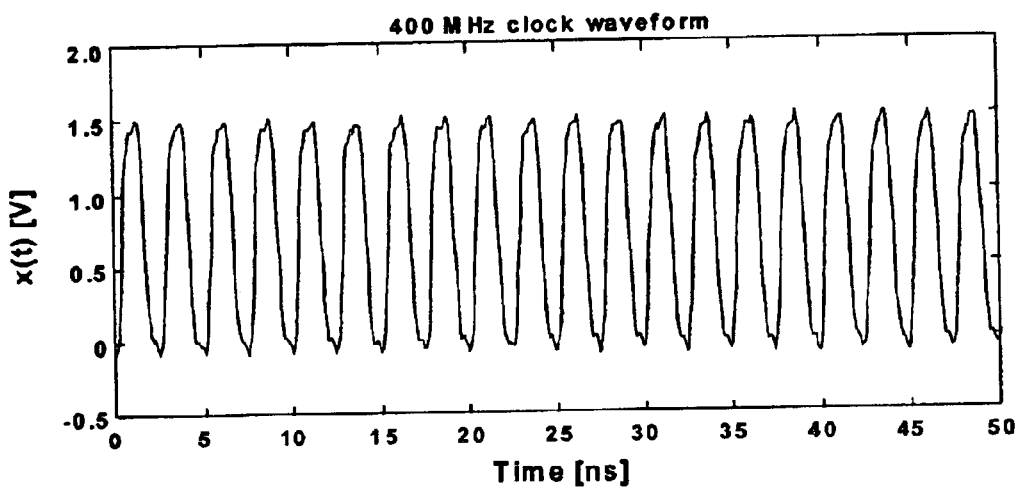
FIG. 9 shows an exemplary clock signal to be measured $x(t)$

Next, algorithm for estimating the instantaneous phase using Hilbert transformation is described. First, the signal to be measured shown in FIG. 9, $$x(t) = A\cos\left(\frac{2\pi}{T_0}t + \phi_0 - \Delta\phi(t)\right) \quad (42)$$

is subjected to Hilbert transformation so as to obtain a signal corresponding to the imaginary part of the complex signal, $$\hat{x}(t) = H[x(t)] = A\sin\left(\frac{2\pi}{T_0}t + \phi_0 - \Delta\phi(t)\right). \quad (43)$$

Thus, the signal to be measured, x(t), is transformed to the analytic signal z(t) as follows.

$$z(t) = \quad (44)$$
$$x(t) + j\hat{x}(t) = A\cos\left(\frac{2\pi}{T_0}t + \phi_0 - \Delta\phi(t)\right) + jA\sin\left(\frac{2\pi}{T_0}t + \phi_0 - \Delta\phi(t)\right)$$

Figure 10:
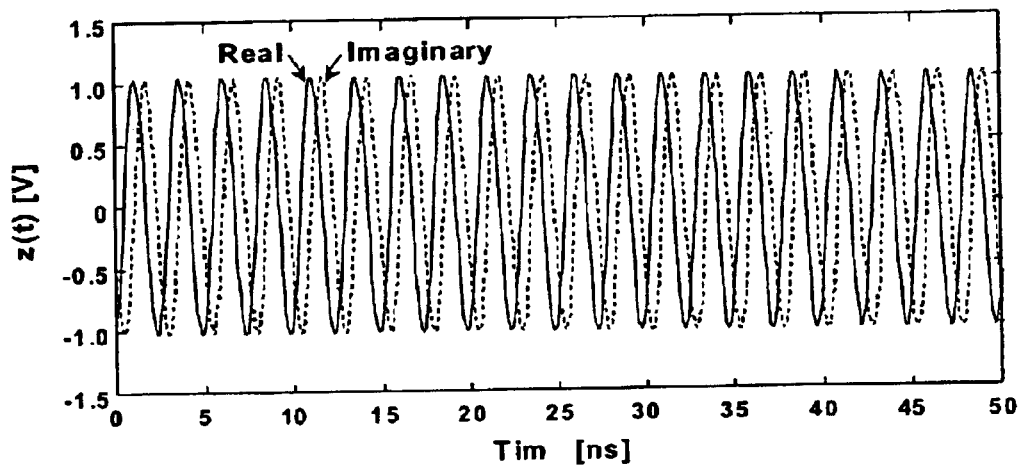
FIG. 10 shows an exemplary analytic signal $z(t)$.

The analytic signal obtained by transformation is shown in FIG. 10. The obtained analytic signal has been subjected to band-pass filtering. This is because the jitter corresponds to the fluctuation of the fundamental frequency of the signal to be measured and therefore only the signal components around the fundamental frequency of the signal to be measured are used in jitter analysis. Then, a phase function φ(t) is estimated from the obtained analytic signal z(t) by using Equation (41).

$$\phi(t) = \left[\frac{2\pi}{T_0}t + \phi_0 - \Delta\phi(t)\right] \bmod 2\pi \text{ [rad]} \quad (45)$$

Figure 11:
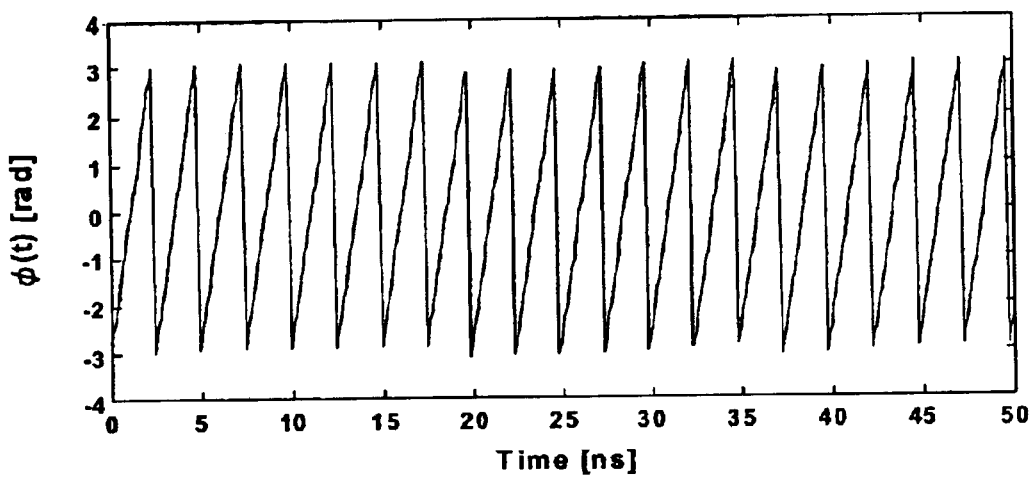
FIG. 11 shows an exemplary instantaneous phase $\phi(t)$. The discontinuities at $-\Pi$ and $+\Pi$ are observed.

The phase function φ(t) is represented using a principal value of the phase in the range from −π to +π and has a discontinuous point in the vicinity of a point at which the phase changes from −π to +π. The estimated phase function φ(t) is shown in FIG. 11. Finally, by unwrapping the discontinuous phase function φ(t) (that is, appropriately adding an integral multiplication of 2π to the principal value φ(t)), the discontinuity can be removed, thereby the continuous instantaneous phase φ(t) can be obtained.

$$\phi(t) = \frac{2\pi}{T_0}t + \phi_0 - \Delta\phi(t) \text{ [rad]} \quad (46)$$

Figure 12:
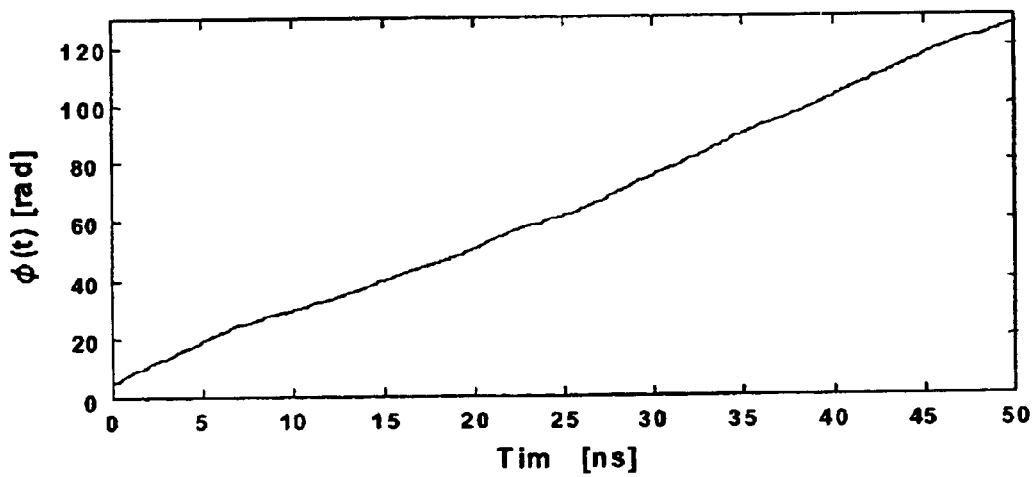
FIG. 12 shows an unwrapped instantaneous phase $\phi(t)$. The discontinuities are

The continuous instantaneous phase function φ(t) after being unwrapped is shown in FIG. 12.

Transformation into Analytic Signal Using Fast Fourier Transformation

The transformation from the real signal to the analytic signal can be achieved by digital signal processing using Fast Fourier Transformation (FFT).

Figure 13:
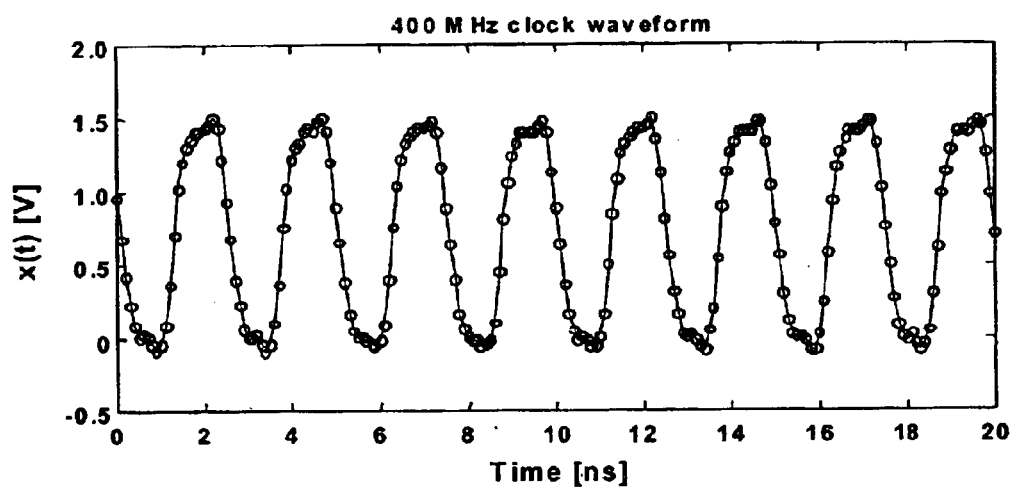
FIG. 13 shows an exemplary digitized clock signal $x(t)$.
Figure 14:
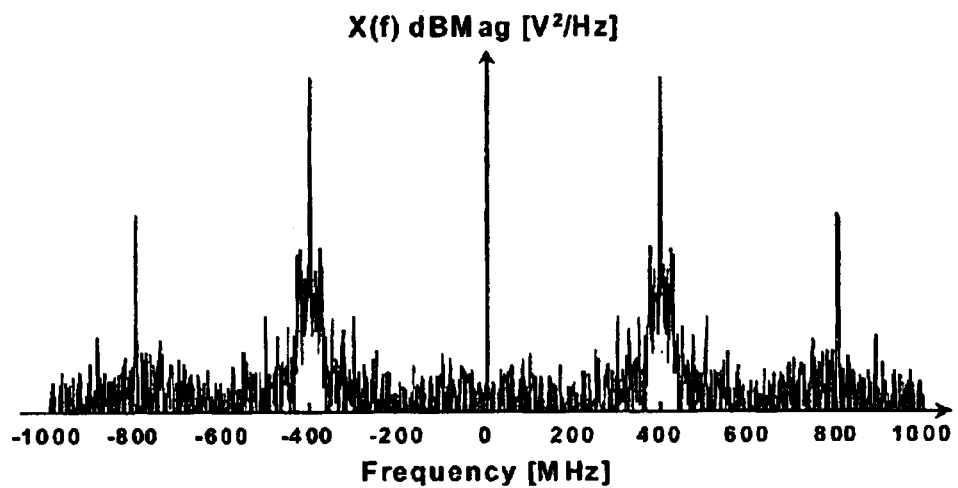
FIG. 14 shows an example of two-sided power spectra of the clock signal $x(f)$ obtained by FFT.
Figure 15:
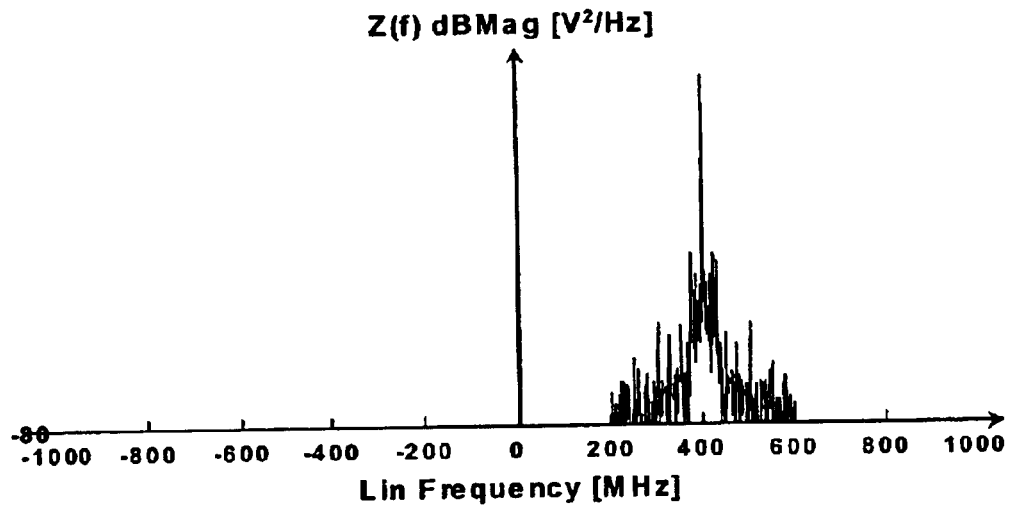
FIG. 15 shows an exemplary band-passed power spectra of the clock signal $Z(f)$.
Figure 16:
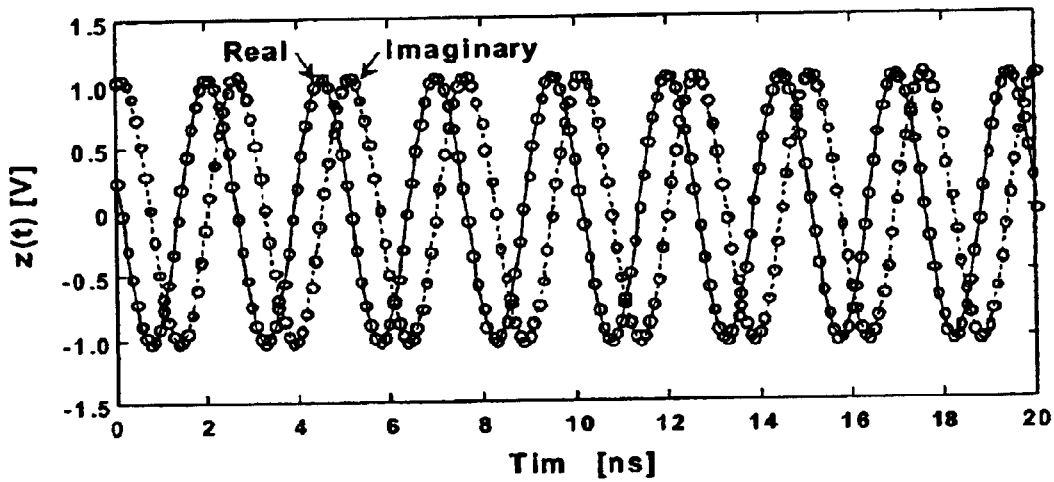
FIG. 16 shows an exemplary band-passed analytic signal $z(t)$ obtained by inverse FFT.

First, FFT is applied to the digitized signal to be measured, x(t), shown in FIG. 13, so that two-sided spectra (which has positive and negative frequencies) x(f) of the signal to be measured is obtained. The obtained two-sided spectra x(f) is shown in FIG. 14. Then, only data around the fundamental frequency in the positive frequency components of x(f) is made to remain while all the other data is replaced with zero, and the positive frequency components are doubled. These operations in the frequency domain correspond to band limiting for the signal and transformation to the analytic signal in the time domain. The thus obtained signal in the frequency domain, Z(f), is shown in FIG. 15. Finally, the obtained signal Z(f) is subjected to inverse FFT, thereby the analytic signal z(t) that has been band limited can be obtained. The analytic signal after being band limited, z(t), is shown in FIG. 16.

Moreover, in a case where the object is to estimate the instantaneous phase, the operation for doubling the positive frequency components can be omitted.

Timing Jitter Estimation

Next, a method for estimating the timing jitter, that is used in the clock skew measuring method of the present embodiment, is described.

The clock signal having no jitter is a square wave having a fundamental frequency $f_0$. This signal can be decomposed into harmonics composed of frequencies of $f_0$, $3f_0$, $5f_0$, . . . by Fourier analysis. Since the jitter corresponds to the fluctuation of the fundamental frequency of the signal to be measured, only the signal components around the fundamental frequency are considered in the jitter analysis.

The fundamental-frequency sinusoidal wave component of the clock signal having jitter (signal to be measured) is represented as follows:

$$x(t) = A\cos(\phi(t)) = A\cos\left(\frac{2\pi}{T_0}t + \phi_0 - \Delta\phi(t)\right) \quad (47)$$

where the amplitude and the fundamental period are A and $T_0$, respectively. In the above, φ(t) is the instantaneous phase of the signal to be measured and is represented by the sum of the linear instantaneous phase component $2\pi t/T_0$ containing the fundamental period $T_0$, the initial phase angle φ (which can be made to be zero in calculation) and the instantaneous phase noise component Δφ(t).

When the instantaneous phase noise component Δφ(t) is zero, the zero-crossing points at which the signal to be measured rises are away from each other with constant periods $T_0$. Δφ(t) that is not zero causes the zero-crossing point of the signal to be measured to fluctuate. That is, Δφ($nT_0$) at the zero-crossing point $nT_0$ represents the time-variant fluctuation at the zero-crossing point, and is called as timing jitter. Thus, the timing jitter of the signal to be measured can be obtained by estimating the instantaneous phase φ(t) of the signal to be measured and then obtaining the difference between the instantaneous phase at the zero-crossing point and the linear phase (that corresponds to the phase waveform of the ideal clock signal having no jitter), $2\pi t/T_0 + \phi$, that is, the instantaneous phase noise Δφ(t).

Figure 17:
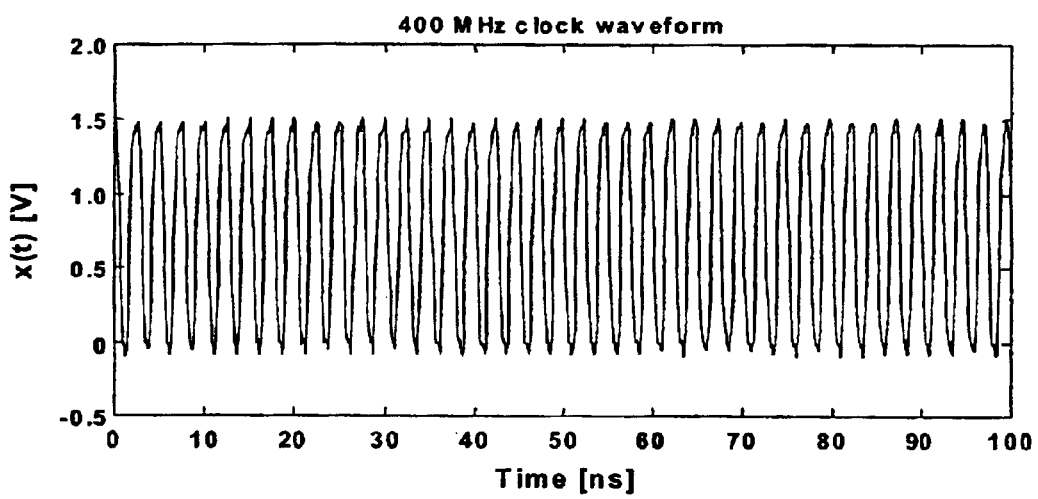
FIG. 17 shows an exemplary clock signal $x(t)$.
Figure 18:
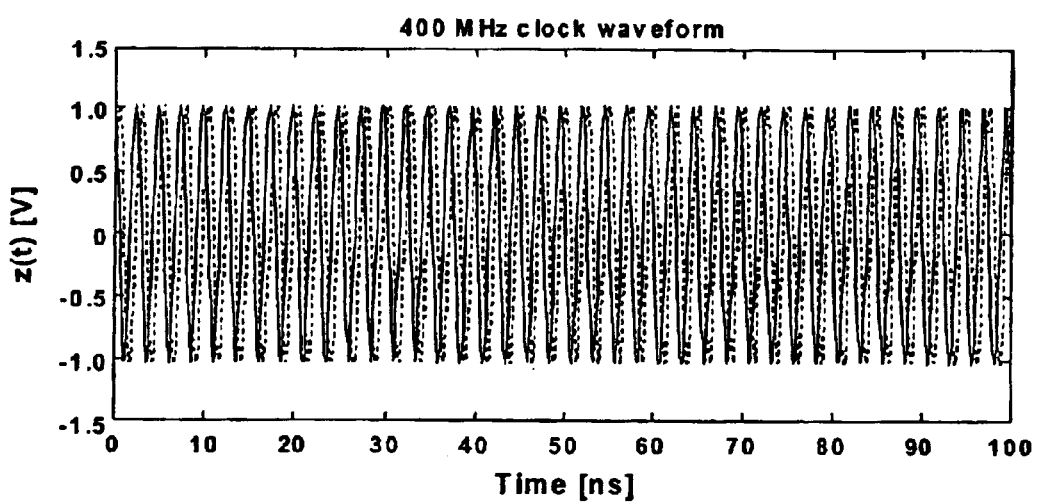
FIG. 18 shows an exemplary analytic signal $z(t)$ of the clock signal $x(t)$.
Figure 19:
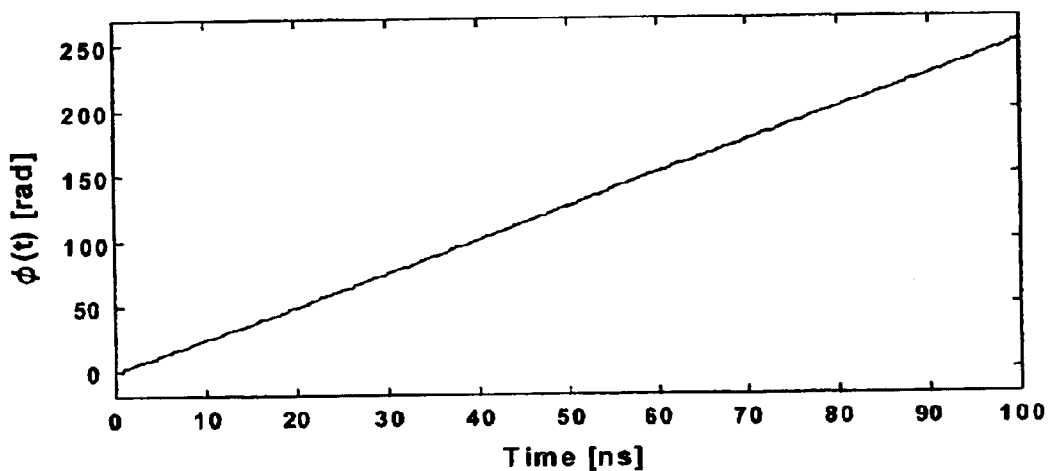
FIG. 19 shows an exemplary instantaneous phase $\phi(t)$.
Figure 20:
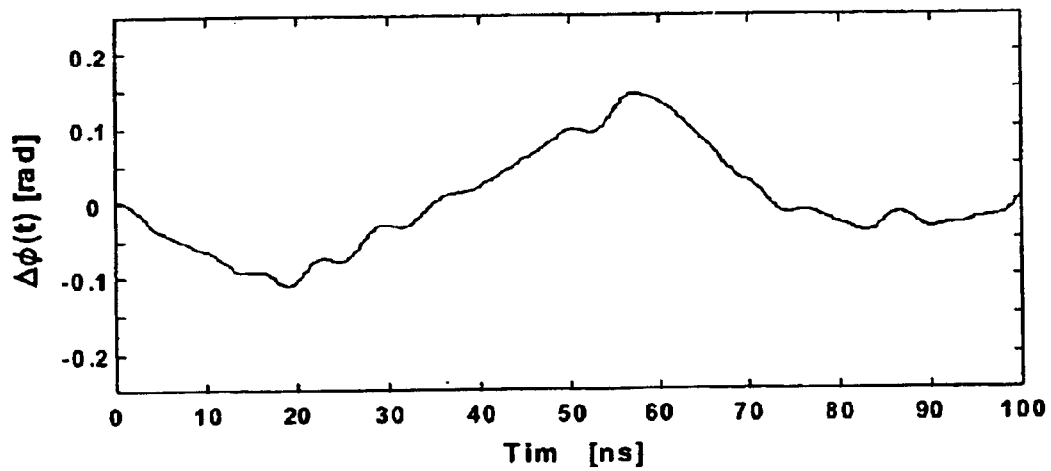
FIG. 20 shows an exemplary instantaneous phase noise $\Delta\phi(t)$.
Figure 21:
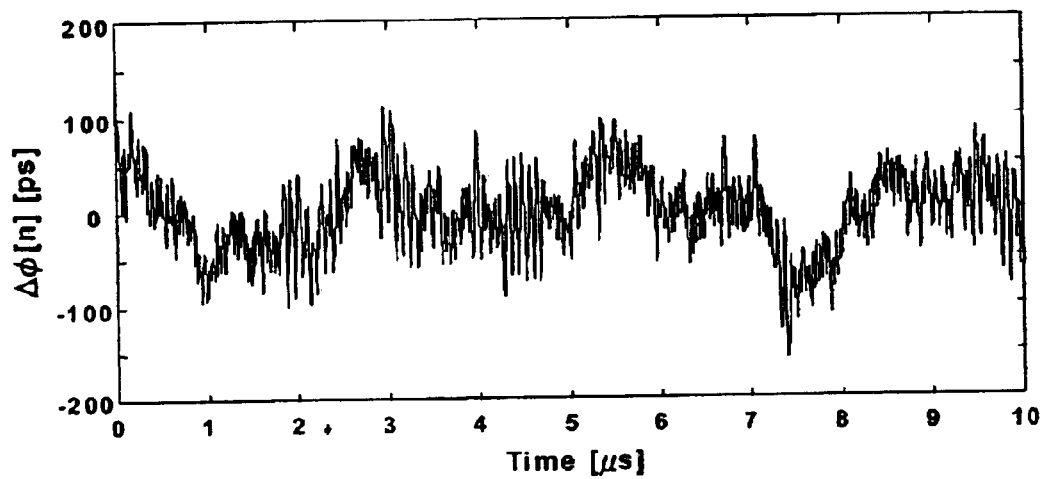
FIG. 21 shows an exemplary timing jitter sequence $\Delta\phi[n]$.

According to the timing jitter estimation method of the present embodiment, the signal to be measured shown in FIG. 17 is first transformed into the analytic signal z(t). The analytic signal z(t) after transformation is shown in FIG. 18. In FIG. 18, the solid line represents the real part of the analytic signal while the broken line represents the imaginary part thereof. Next, the instantaneous phase φ(t) of the signal to be measured is estimated from the analytic signal z(t). The instantaneous phase waveform φ(t) obtained by the estimation is shown in FIG. 19. Next, a least squares fit of a straight line is performed for the instantaneous phase data, thereby obtaining the linear instantaneous phase $\phi_{linear}(t)$ that corresponds to the instantaneous phase waveform of the ideal signal having no jitter. Then, the instantaneous phase noise component of the signal to be measured, Δφ(t), is obtained by calculating the difference between the instantaneous phase φ(t) and the linear instantaneous phase $\phi_{linear}$(t). The obtained instantaneous phase noise waveform Δφ(t) is shown in FIG. 20. Then, the instantaneous phase noise waveform Δφ(t) is sampled at timings (approximated zero-crossing points) which are the closest timings to the respective zero-crossing points of the real part x(t) of the analytic signal z(t), and the instantaneous phase noise at the zero-crossing timing $nT_0$, that is, the timing jitter $\Delta\phi[n](=\Delta\phi(nT_0))$ is then estimated. The waveform of the estimated timing jitter, $\Delta\phi[n]$, is shown in FIG. 21.

In the timing jitter estimation method of the present embodiment, the timing jitter may be estimated by removing amplitude modulation (AM) components of the signal to be measured by means of a waveform clipper so as to make only phase modulation (PM) components corresponding to the jitter remain, thereby the high-precision jitter estimation can be performed.

Moreover, in the timing jitter estimation method of the present embodiment, low-frequency components of the phase noise signal may be removed by means of a low-frequency component remover.

Detection Method of Approximated Zero-Crossing Point

Figure 22:
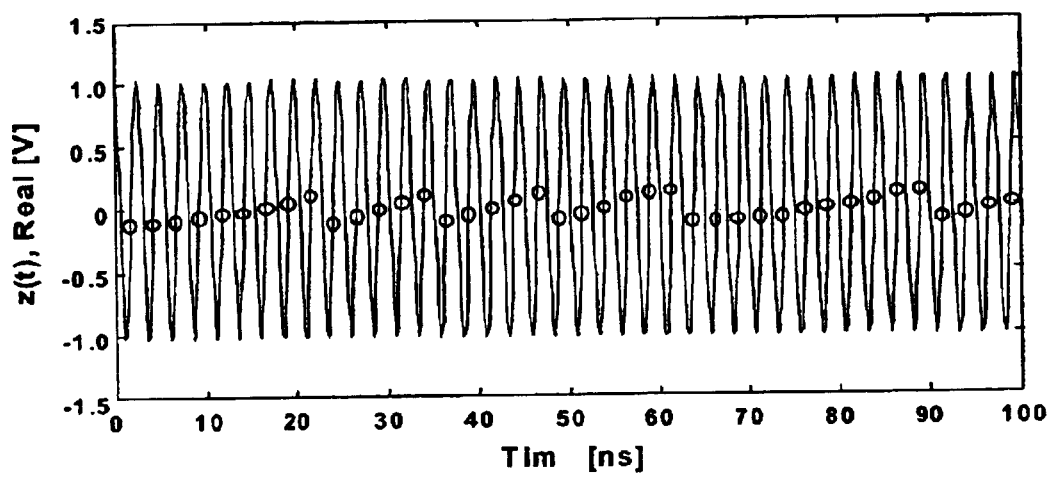
FIG. 22 shows exemplary adaptive zero-crossing points approximation.

Next, how to detect the approximated zero-crossing point is described. First, assuming that the maximum value and the minimum value of the real part x(t) of the analytic signal of the input signal to be measured are values at 100% level and 0% level, respectively, a signal value at 50% level, $V_{50}\%$, is calculated as a level of the zero cross. Then, differences between adjacent sampled values of x(t) and the 50%-level value $V_{50}\%$, $(x(j-1)-V_{50}\%)$ and $(x(j)-V_{50}\%)$, are obtained and thereafter the product of these differences, $(x(j-1)-V_{50}\%) \times (x(j)-V_{50}\%)$ is calculated. When x(t) goes across 50% level, i.e., the zero-crossing level, signs of these sampled values $(x(j-1)-V_{50}\%)$ and $(x(j)-V_{50}\%)$ change from minus to plus or from plus to minus. Thus, when the above product is negative, it is determined that x(t) goes across the zero-crossing level. Therefore, one of the times (j-1) and j which corresponds with one of the sampled values $(x(j-1)-V_{50}\%)$ and $(x(j)-V_{50}\%)$ that has a smaller absolute value than the other at that time, is obtained as the approximated zero-crossing point. FIG. 22 shows the waveform of the real part x(t) of the analytic signal. A mark in FIG. 22 represents the closest point (approximated zero-crossing point) to the rising zero-crossing point detected.

Waveform Clipping

Figure 23:
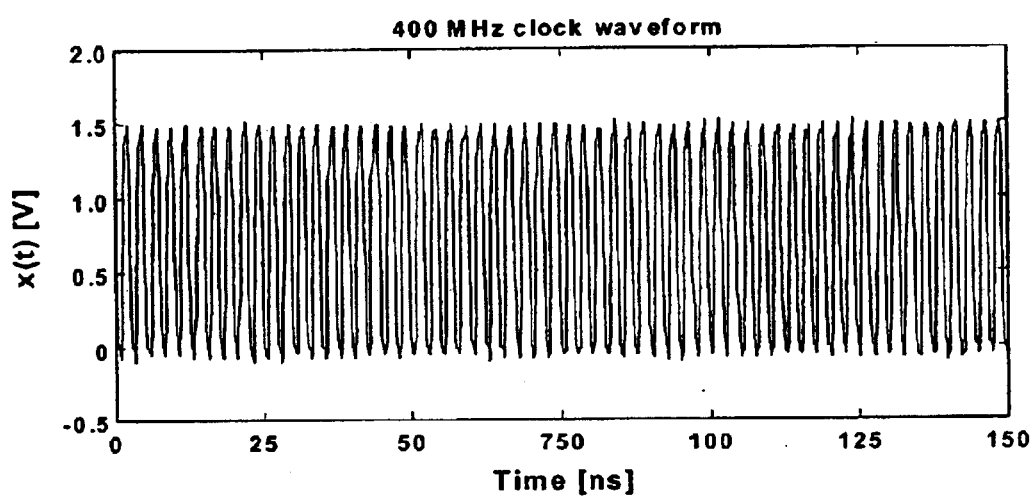
FIG. 23 shows an exemplary clock signal with AM components.
Figure 24:
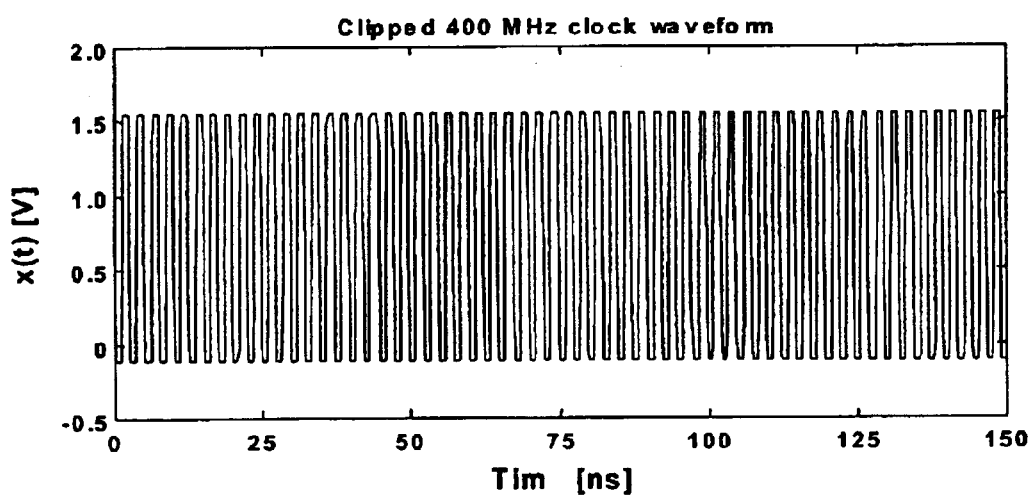
FIG. 24 shows an exemplary clock signal without AM components.

A waveform clipper removes the AM components from the signal input thereto and makes only the PM components corresponding to the jitter remain. The waveform clipping is achieved by 1) multiplying the input signal which is analog or digital by a constant; 2) replacing a signal value that is larger than a predetermined threshold value 1 with the threshold value 1; and 3) replacing a signal value that is smaller than another predetermined threshold value 2 with the other threshold value 2. Here it is assumed that the threshold value 1 is larger than the threshold value 2. The clock signal containing the AM components is shown in FIG. 23. Since an envelope of the time-variant waveform is varied, the AM components are understood to exist. On the other hand, FIG. 24 shows the clock signal after being clipped by the waveform clipper. The time-variant waveform in FIG. 24 has a constant envelope and therefore it is confirmed that the AM components are removed.

Hereinafter, another example of the clock skew measuring apparatus of the present embodiment is described. For simplification, an example of the apparatus and method for measuring the clock skew between two signals to be tested is described below. However, the present invention can measure the clock skews between three or more clock signals in a similar manner.

Figure 25:
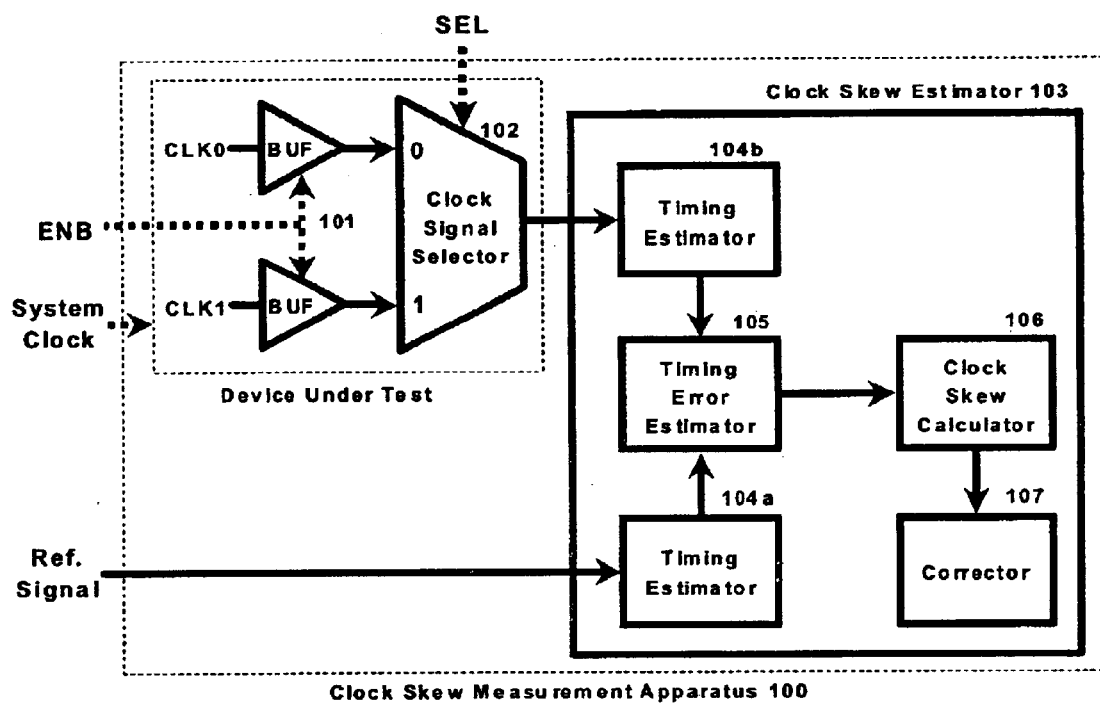
FIG. 25 shows an exemplary structure of a clock skew measurement apparatus of the present invention.

FIG. 25 illustrates another exemplary structure of the clock skew measuring apparatus of the present embodiment. The clock skew measuring apparatus 100 includes buffers 101 having signal inputs ENB for selecting whether or not a plurality of clock signals to be tested in a device under test are to be output to the outside of the chip, respectively, a clock signal selector 102 for outputting the clock signals to be tested selecting one of the clock signals input thereto one by one, which has a clock signal selecting input SEL; and a clock skew estimator 103 for measuring a timing difference between a reference signal input to the device under test and the clock signal selected by the clock signal selector for each of the clock signals to be tested, thereby obtaining the clock skew between the clock signals to be tested. The clock skew estimator 103 includes a timing estimator 104a which obtains edge timing of the reference signal (reference edge timing), another timing estimator 104b which obtains edge timing of the clock signal to be tested (tested timing), a timing error estimator 105 which obtains the timing difference between the tested timing and the reference timing, a clock skew calculator 106 which obtains the clock skew between the clock signals to be tested from the timing difference obtained for each of the clock signals to be tested, and a corrector 107 which corrects a value of the clock skew obtained by the clock skew calculator 106. A specific structure of the timing estimator will be described later.

Figure 26:
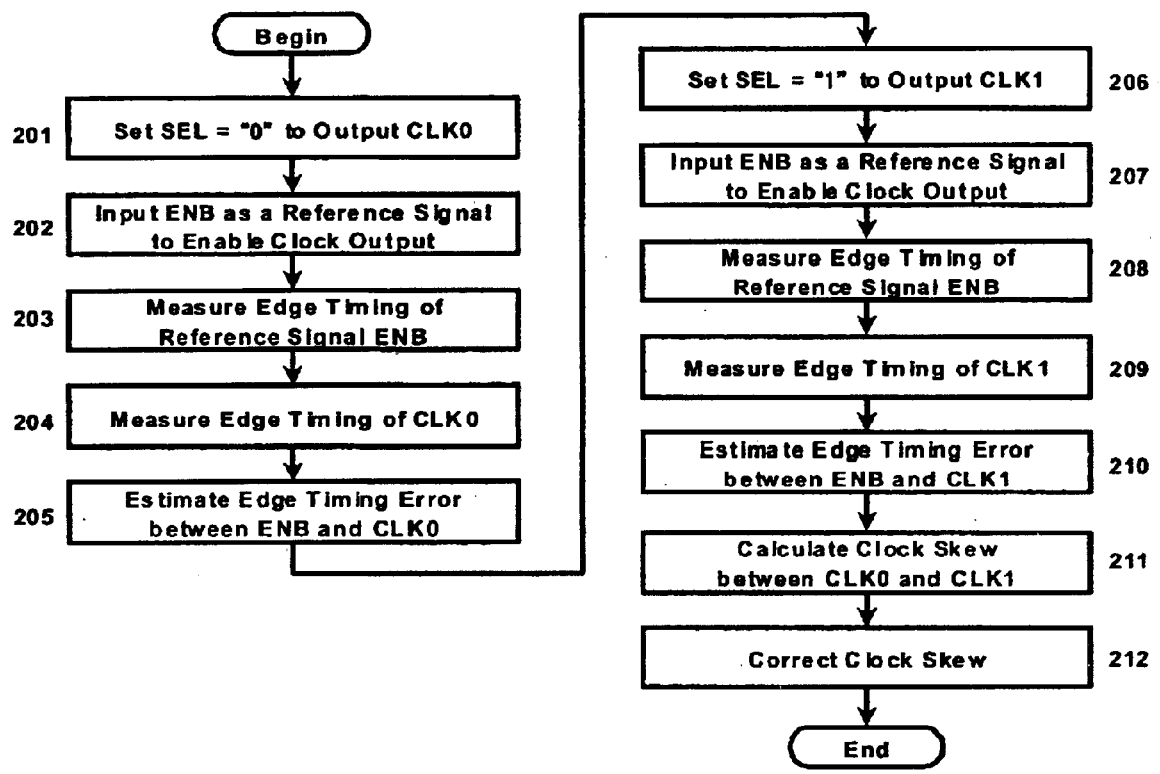
FIG. 26 is a flowchart of an exemplary clock skew measurement method of the present invention.

Next, a clock skew measuring operation of the clock skew measuring apparatus 100 of the present embodiment is described. FIG. 26 shows an exemplary procedure of the clock skew measuring method of the present embodiment. First, in Step 201, "0" is supplied to the selecting input SEL of the clock signal selector 102, thereby selecting the clock signal CLK0. Then, in Step 202, a signal input which enables the buffer output is supplied to the ENB inputs of the buffers 101 as a reference signal of the clock skew measurement in synchronization with the reference clock edge of the device under test. Then, the timing estimator 104a measures the edge timing of the reference signal ENB in Step 203, and the timing estimator 104b measures the edge timing of the clock signal CLK0, that is output to the clock output pin of the device under test, in Step 204. In Step 205, the timing error estimator 105 obtains the timing difference between the tested timing measured in Step 204 and the reference timing measured in Step 203. Next, in Step 206, "1" is supplied to the selecting input SEL of the clock signal selector 102, thereby selecting the clock signal CLK1. Then, in Step 207, the signal input which enables the buffer output is supplied to the ENB input of the buffers 101 as the reference signal of the clock skew measurement in synchronization with the reference clock edge of the device under test. Then, the timing estimator 104a measures the edge timing of the reference signal ENB in Step 208, and the timing estimator 104b measures the edge timing of the clock signal CLK1, that is output to the clock output pin of the device under test, in Step 209. In Step 210, the timing error estimator 105 obtains the timing difference between the tested timing measured in Step 209 and the reference timing measured in Step 208. Next, in Step 211, the clock skew calculator 106 calculates the clock skew between CLK0 and CLK1 by obtaining the difference between the timing differences measured in Steps 205 and 210. Finally, in Step 212, the corrector 107 corrects the clock skew obtained in Step 212, thereby finishing the procedure. In Steps 205 and 210 in which the difference between the tested timing and the reference timing is obtained, the timing error estimator 105 obtains that timing difference in accordance with Equations (5) and (6). Moreover, in Step 211 where the clock skew between CLK0 and CLK1 is obtained, the clock skew calculator 106 calculates the difference between the timing differences by using Equation (7). In addition, in Step 212 for correcting the obtained clock skew, the corrector 107 corrects the clock skew with the difference between the delay times of the lines (wires) by using Equation (8). In step 211, the clock skew calculator 106 may obtain the absolute value of Equation (7), if necessary. Moreover, Step 212 may be omitted when the lines for outputting the clocks are designed and layout in such a manner that the difference between the delay times of the lines is zero. Furthermore, in order to improve the precision of the clock skew measurement, Steps 201 to 212 may be repeated a plurality of times so that an average of the obtained clock skews can be obtained.

Figure 27:
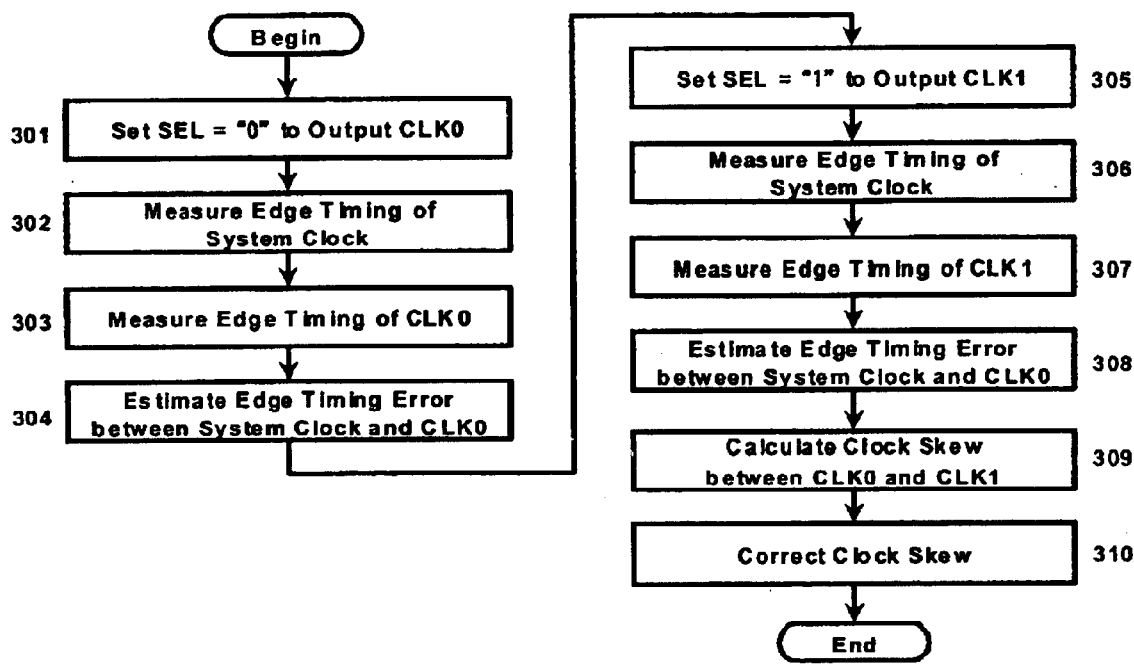
FIG. 27 is a flowchart of another exemplary clock skew measurement method of the present invention.

FIG. 27 shows another exemplary procedure of the clock skew measuring method of the present invention. First, in Step 301, "0" is supplied to the selecting input SEL of the clock signal selector 102, thereby selecting CLK0. Then, in Step 302, the timing estimator 104*a* measures the system clock input to the device under test, so as to obtain the reference edge timing. In Step 303, the timing estimator 104*b* measures the edge timing of the clock signal CLK0 that is output to the clock output pin of the device under test. The timing error estimator 105 then obtains the timing difference between the tested timing measured in Step 303 and the reference timing measured in Step 302, in Step 304. Next, instep 305, "1" is supplied to the selecting input SEL of the clock signal selector 102, thereby selecting CLK1. Then, in Step 306, the timing estimator 104*a* measures the system clock so as to obtain the reference edge timing. In Step 307, the timing estimator 104*b* measures the edge timing of the clock signal CLK1 that is output to the clock output pin of the device under test. The timing error estimator 105 then obtains the timing difference between the tested timing measured in Step 307 and the reference timing measured in Step 306, in Step 308. Then, in Step 309, the clock skew calculator 106 obtains the clock skew between CLK0 and CLK1 by obtaining the difference between the timing differences measured in Steps 304 and 308. Finally, in Step 310, the corrector 107 corrects the clock skew obtained in Step 309, thereby finishing the procedure. In Steps 304 and 308 where the timing difference between the tested timing and the reference timing is obtained, the timing error estimator 105 obtains that timing difference, that is, the skew between the system clock and the clock signal to be measured, in accordance with Equations (35) and (36). Moreover, in Step 309 where the clock skew between CLK0 and CLK1 is obtained, the clock skew calculator 106 calculates the difference between the timing differences by using Equation (37). In addition, in Step 310 for correcting the obtained clock skew, the corrector 107 corrects the clock skew with the difference between the delay times of the lines by using Equation (38). In step 309, the clock skew calculator 106 may obtain the absolute value of Equation (37), if necessary. Moreover, Step 310 may be omitted when the lines for outputting the clocks are designed and laid out in such a manner that the difference between the delay times of the lines is zero. Furthermore, Steps 302, 303, 306 and 307 for obtaining the edge timings of the clock signals may be replaced with a procedure shown in FIG. 29.

Figure 28:
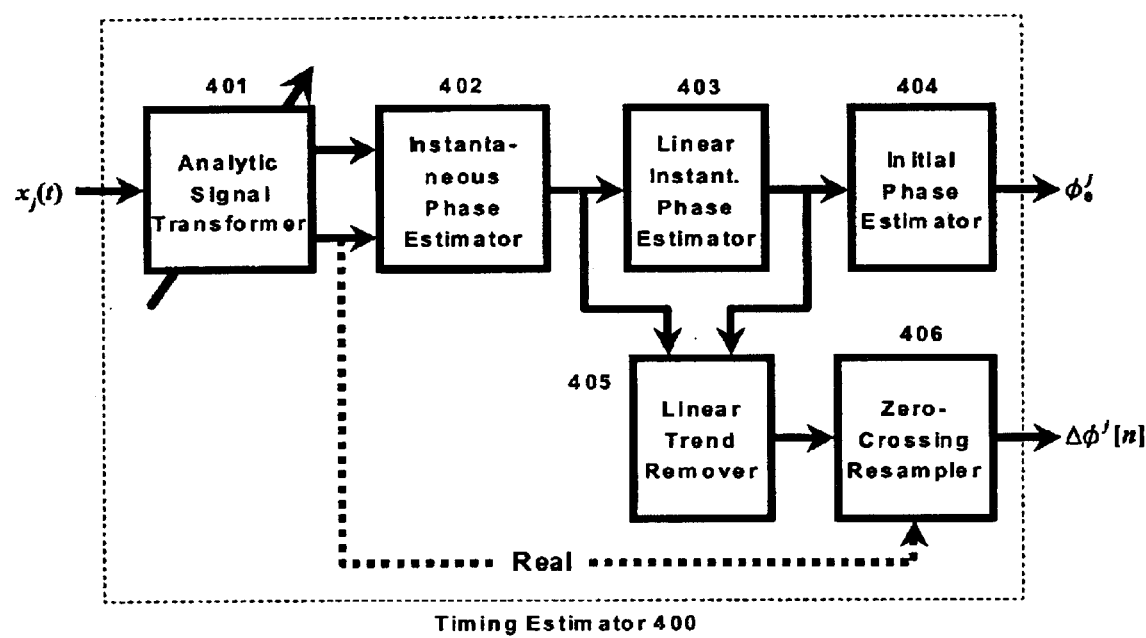
FIG. 28 shows an exemplary structure of a timing estimator included in the clock skew measurement apparatus of the present invention.

The timing estimators 104*a* and 104*b* mentioned above can be arranged as shown in FIG. 28. FIG. 28 shows an exemplary structure of the timing estimator of the present embodiment. The timing estimator 400 includes an analytic signal transformer 401 which transforms the clock signal input thereto into a complex analytic signal; an instantaneous phase estimator 402 for obtaining an instantaneous phase of the analytic signal; a linear instantaneous phase estimator 403 for obtaining a linear instantaneous phase of the input signal from the instantaneous phase; an initial phase estimator 404 for obtaining an ideal edge timing of the input clock signal by obtaining an initial phase angle of the linear instantaneous phase; a linear trend remover 405 for removing the linear instantaneous phase from the instantaneous phase so as to obtain an instantaneous phase noise; and a zero-crossing resampler 406 for re-sampling only the instantaneous phase noise data around zero-crossing timings of the real part of the analytic signal and outputting the timing jitter sequence of the input signal. The analytic signal transformer 401 can have the structure shown in any of FIGS. 30, 32 and 34.

Figure 29:
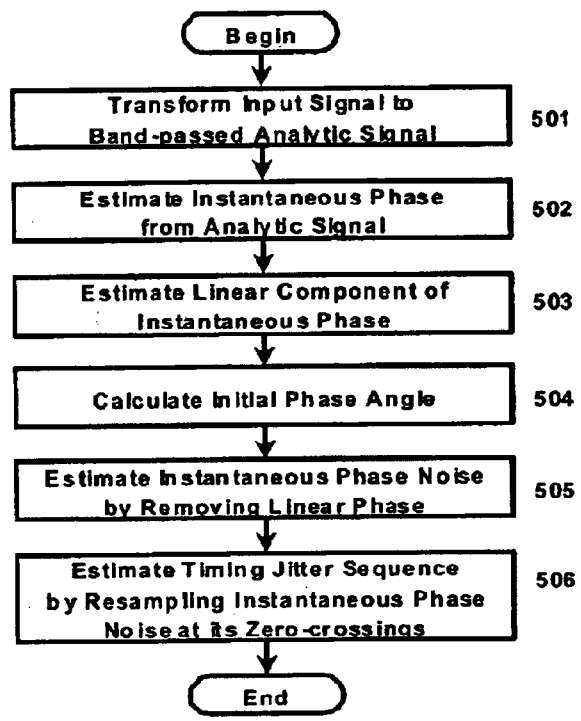
FIG. 29 is a flowchart of an exemplary timing estimation method included in the clock skew measurement method of the present invention.

Next, an operation of the timing estimator 400 of the present embodiment for estimating the edge timing of the clock signal to be measured is described. FIG. 29 shows an exemplary procedure of the timing estimation in the present embodiment. First, in Step 501, the analytic signal transformer 401 transforms the input clock signal to be measured into the analytic signal containing predetermined frequency components allowed to pass therethrough. Then, in Step 502, the instantaneous phase estimator 402 estimates the instantaneous phase of the signal to be measured by using the analytic signal obtained by the analytic signal transformer 401. The linear phase estimator 403 then estimates the linear instantaneous phase corresponding to an ideal clock signal from the instantaneous phase estimated by the instantaneous phase estimator 402, in Step 503. Then, in Step 504, the initial phase estimator 404 obtains the ideal edge timing of the input clock signal by obtaining the initial phase angle of the linear instantaneous phase estimated by the linear phase estimator 403. In Step 505, the linear trend remover 405 estimates the instantaneous phase noise by removing the linear instantaneous phase from the instantaneous phase. Finally, in Step 506, the zero-crossing resampler 406 re-samples the instantaneous phase noise data that is close to the zero-crossing timings of the real part of the analytic signal so as to estimate the timing jitter sequence, thereby finishing the procedure.

In Step 504 where the ideal edge timing of the input clock signal is obtained, the initial phase estimator 404 obtains the ideal edge timing in accordance with Equation (22). In addition, Step 501 can be performed in accordance with a procedure shown in any of FIGS. 31, 33 and 35.

The timing estimator shown in FIG. 28 can be constructed as an estimator which estimates only the ideal edge timing of the input clock signal. In this case, the linear trend remover 405 for obtaining the instantaneous phase noise by removing the linear instantaneous phase from the instantaneous phase and the zero-crossing resampler 406 for obtaining the timing jitter sequence of the input signal from the instantaneous phase noise can be omitted. Similarly, the timing estimating method shown in FIG. 29 may estimate only the ideal edge timing of the input clock signal. In this case, Step 505 for estimating the instantaneous phase noise by removing the linear instantaneous phase from the instantaneous phase and Step 506 for estimating the timing jitter sequence from the instantaneous phase noise can be omitted.

Figure 30:
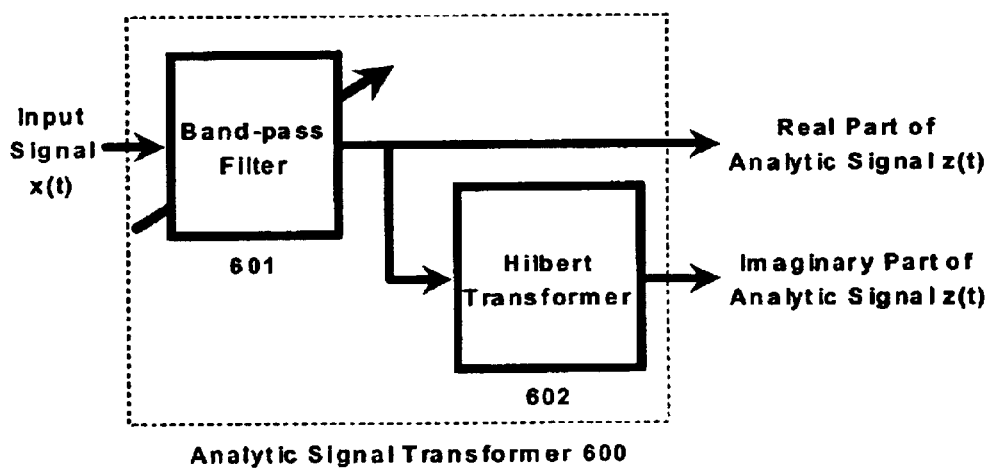
FIG. 30 shows an exemplary structure of an analytic signal transformer included in the clock skew measurement apparatus of the present invention.

FIG. 30 shows an exemplary structure of the analytic transformer included in the timing estimator 400 of the present embodiment. An analytic signal transformer 600 includes a band-pass filter 601 for extracting, from the signal to be measured, only the components around the fundamental frequency of the signal to be measured, thereby band-limiting the signal to be measured; and a Hilbert transformer 602 for performing Hilbert transformation for the output signal of the band-pass filter 601 so as to generate Hilbert transform pairs of the input signal. The band-pass filter 601 may be an analog filter or a digital filter, and may be implemented by using digital signal processing such as FFT.

In addition, the band-pass filter 601 may be constructed in such a manner that the passband of the signal can be changed freely.

Figure 31:
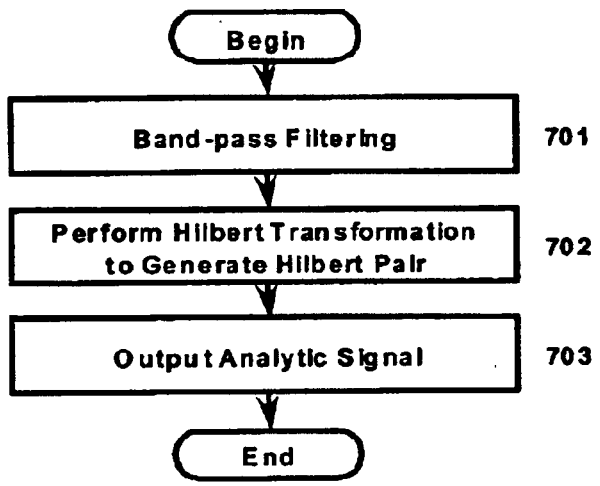
FIG. 31 is a flowchart of an exemplary analytic signal transformation method included in the clock skew measurement method of the present invention.

Next, an operation of the analytic signal transformer 600 of the present embodiment for transforming the signal to be measured into the analytic signal that has been band-limited is described. FIG. 31 shows an exemplary procedure of the signal transformation of the present embodiment. First, in Step 701, the band-pass filter 601 extracts from the signal to be measured the frequency components around the fundamental frequency thereof, thereby limiting the band of the signal. Then, in Step 702, the Hilbert transformer 602 applies Hilbert transformation to the signal to be measured, that has been subjected to band limiting, thereby generating the Hilbert transform pairs of the input signal, that correspond to the imaginary part of the analytic signal. Finally, in Step 703, the analytic signal transformer 600 outputs the output signal of the band-pass filter 601 as the real part of the analytic signal and the output signal of the Hilbert transformer 702 as the imaginary part of the analytic signal, thereby finishing the procedure.

Figure 32:
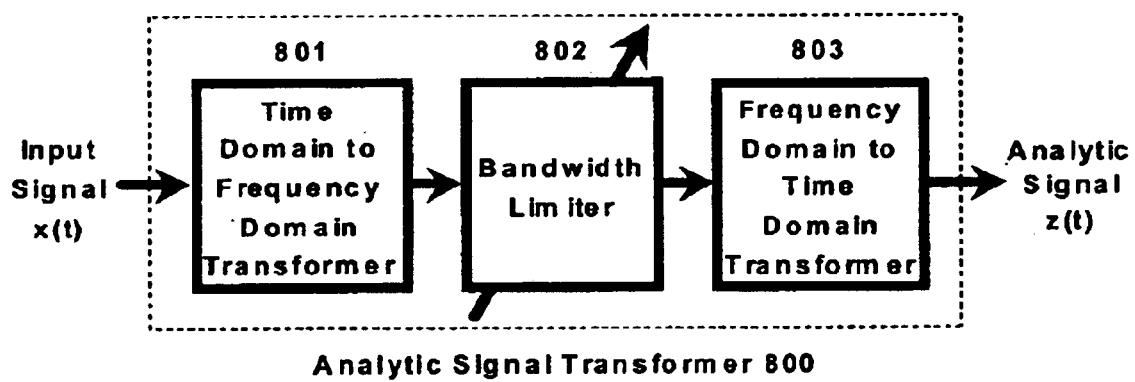
FIG. 32 shows another exemplary structure of an analytic signal transformer included in the clock skew measurement apparatus of the present invention.

FIG. 32 shows another exemplary structure of the analytic signal transformer included in the timing estimator 400 of the present embodiment. The analytic signal transformer 800 includes a time-domain to frequency-domain transformer 801 for transforming the signal to be measured into two-sided spectra in the frequency domain; a bandwidth limiter 802 for extracting only frequency components around the positive fundamental frequency of the two-sided spectra in the frequency domain; and a frequency-domain to time-domain transformer 803 for performing inverse transformation for the output of the band-litter 802 into a signal in the time domain. The time-domain to frequency-domain transformer 801 and the frequency-domain to time-domain transformer 803 may be implemented by using FFT and inverse FFT, respectively. Moreover, the bandwidth limiter 802 may be arranged in such a manner that the passband of the signal can be changed freely.

Figure 33:
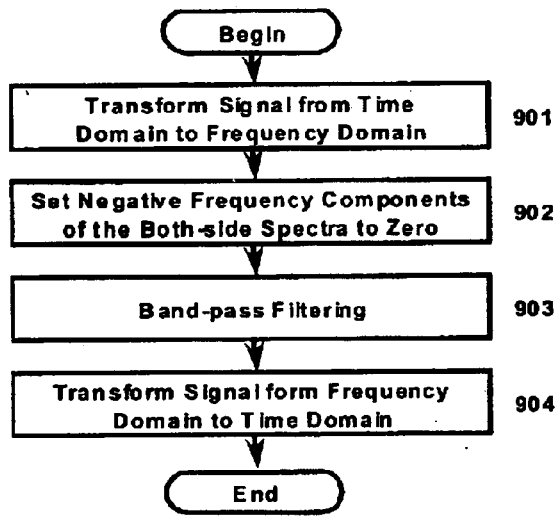
FIG. 33 is a flowchart of another exemplary analytic signal transformation method included in the clock skew measurement method of the present invention.

Next, an operation of the analytic signal transformer 800 of the present embodiment for transforming the signal to be measured into the analytic signal that has been band-limited is described. FIG. 33 shows another exemplary procedure of the signal transformation of the present embodiment. First, in Step 901, the time-domain to frequency-domain transformer 801 performs FFT for the signal to be measured, thereby transforming the signal in the time domain into the two-sided spectra in the frequency domain. Then, the bandwidth limiter 802 replaces the negative frequency components of the two-sided spectra in the frequency domain with zeros in Step 902, and then replaces, in the one-sided spectra in which the negative frequency components have been replaced with zeros, the frequency components other than the frequency components around the fundamental frequency of the signal to be measured with zeros so as to leave only the components around the fundamental frequency in Step 903, thereby the signal in the frequency domain is band-limited. Finally, in Step 904, the frequency-domain to time-domain transformer 803 performs inverse FFT for the one-sided spectra that has been band-limited so that the frequency-domain signal is transformed into the time-domain signal, thereby finishing the procedure. In this procedure, the order in which Steps 902 and 903 are performed may be changed so that Step 902 follows Step 903. Moreover, in Steps 902 and 903, the negative frequency components in the two-sided spectra may be replaced with zeros after the signal to be measured is band-limited by replacing the frequency components other than the components around the fundamental frequency of the signal to be measured with zeros so as to leave only the frequency components around the fundamental frequency.

Figure 34:
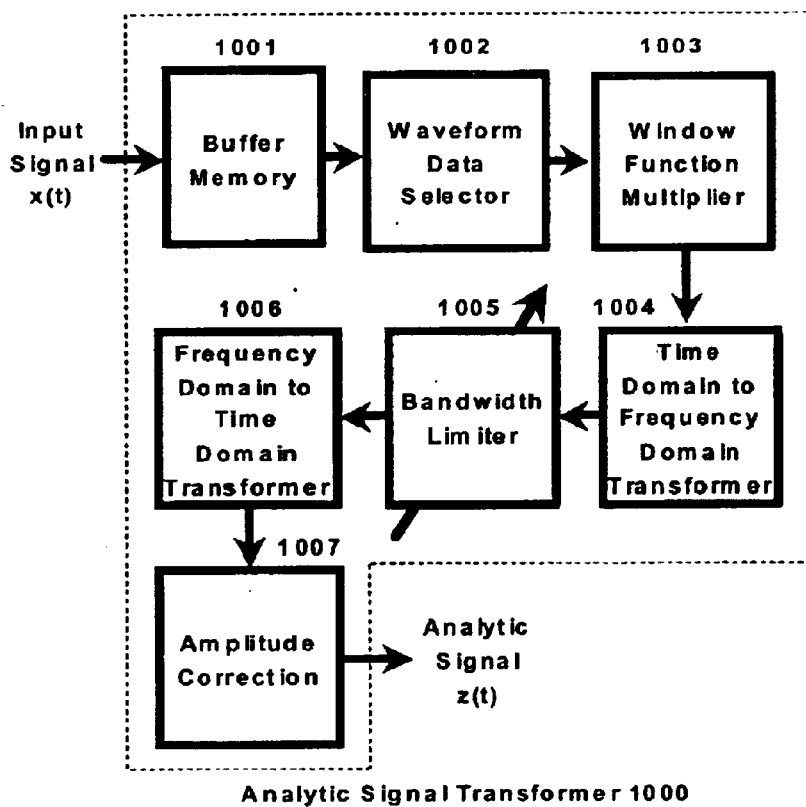
FIG. 34 shows still another exemplary structure of an analytic signal transformer included in the clock skew measurement apparatus of the present invention.

FIG. 34 shows another exemplary structure of the analytic signal transformer included in the timing estimator 400 of the present embodiment. The analytic signal transformer 1000 includes a buffer memory 1001 for storing the signal to be measured; a waveform data selector 1002 for successively extracting a section of the signal from the buffer memory 1001 in such a manner that the section of the signal extracted presently partially overlaps the previously extracted section; a window function multiplier 1003 for multiplying the extracted signal section by a window function; a time-domain to frequency-domain transformer 1004 for transforming the signal section after multiplication by the window function into the two-sided spectra in the frequency domain; a band-width limiter 1005 for extracting the frequency components around the positive fundamental frequency of the signal to be measured from the two-sided spectra; a frequency-domain to time-domain transformer 1006 for inversely transforming the output of the bandwidth limiter 1005 to a time-domain signal; and an inverse-window function multiplier 1007 for obtaining the analytic signal that has been band-limited by multiplying the time-domain signal by the reciprocal of the window function. The time-domain to frequency-domain transformer 1004 and the frequency-domain to time-domain transformer 1006 may be implemented by using FFT and inverse FFT, respectively. Moreover, the bandwidth limiter 1005 may be arranged in such a manner that the passband of the signal can be changed freely.

Figure 35:
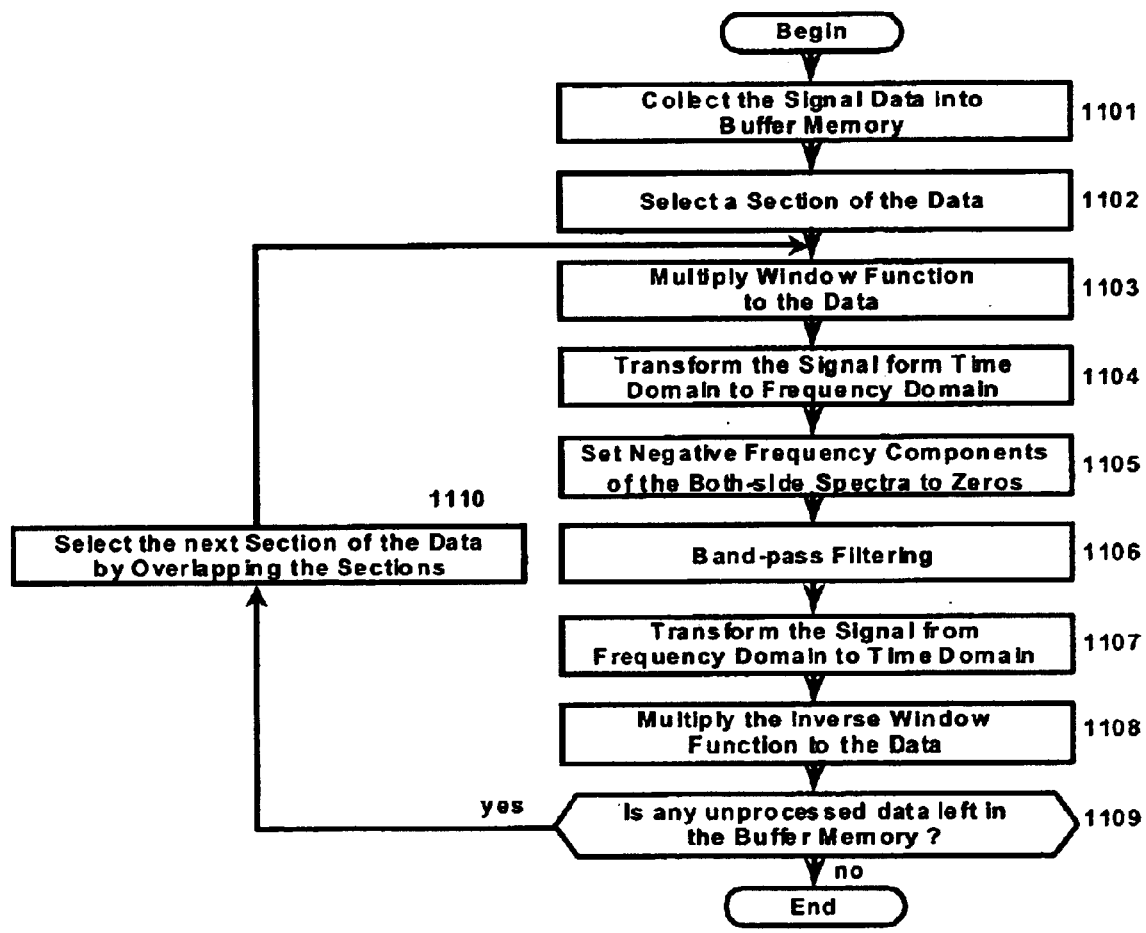
FIG. 35 is a flowchart of still another exemplary analytic signal transformation method included in the clock skew measurement method of the present invention.

Next, an operation of the analytic signal transformer 1000 of the present embodiment for transforming the signal to be measured into the analytic signal that has been band-limited is described. FIG. 35 shows another exemplary procedure of the signal transformation of the present embodiment. First, in Step 1101, the signal to be measured is stored in the buffer memory 1001. Then, in Step 1102, the waveform data selector 1002 selects a section of the signal stored in the buffer memory 1001 and extracts it. In Step 1103, the window function multiplier 1003 multiplies the extracted section by the window function. In Step 1104, the time-domain to frequency-domain transformer 1004 performs FFT for the section of the signal, i.e., the partial signal, after being multiplied by the window function, thereby transforming the time-domain signal into the two-sided spectra in the frequency domain. Then, the bandwidth limiter 1005 replaces the negative frequency components of the two-sided spectra in the frequency domain with zero in Step 1105 and thereafter replaces the frequency components other than those around the fundamental frequency of the signal to be measured with zeros so as to leave only the components around the fundamental frequency, thereby band-limiting the frequency-domain signal. Then, in Step 1107, the frequency-domain to time-domain transformer 1006 performs inverse FFT for the one-sided spectra in the frequency domain after being band-limited, so as to transform the frequency-domain signal into the time-domain signal. In Step 1108, the inverse window function multiplier 1007 multiplies the time-domain signal after being subjected to the inverse transformation, by the inverse of the window function used in the multiplication in Step 1103. As a result, the analytic signal that has been band-limited is obtained. Finally, in Step 1109, it is checked whether or not the data that has not been processed is stored in the buffer memory 1001. If the data that has not been processed is stored, the waveform data selector 1002 selects and extracts a section of the data successively in such a manner that the presently selected section partially overlaps the previously selected section, and thereafter Steps 1103, 1104, 1105, 1106, 1107, 1108 and 1109 are repeated. In a case of no data that has not been processed, the procedure is finished. In this procedure, the order in which Steps 1105 and 1106 are performed may be changed so that Step 1105 follows Step 1106. Moreover, in Steps 1105 and 1106, the negative frequency components in the two-sided spectra may be replaced with zeros after the signal to be measured is band-limited by replacing the frequency components other than the components around the fundamental frequency of the signal to be measured with zeros so as to leave only the frequency components around the fundamental frequency.

Figure 36:
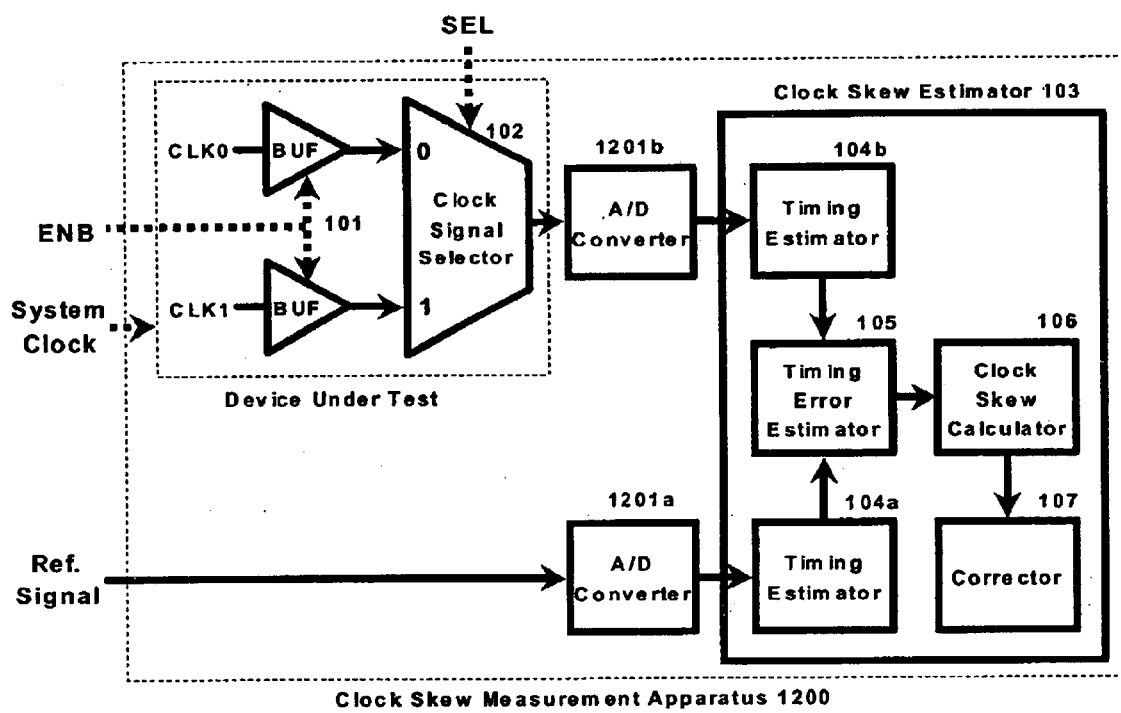
FIG. 36 shows another exemplary structure of a clock skew measurement apparatus of the present invention.

FIG. 36 shows another exemplary structure of the clock skew measuring apparatus of the present embodiment. The clock skew measuring apparatus 1200 has the same structure as that shown in FIG. 25 except that analog-to-digital (AD) converters 1201*a* and 1201*b* are provided for digitizing an analog signal to be measured so as to convert it to a digital signal. (For simplification, the description for the same components as those shown in FIG. 25 is omitted.) As the AD converter, it is desirable to use a high-speed AD converter, a digitizer, and a digital-sampling oscilloscope.

Figure 37:
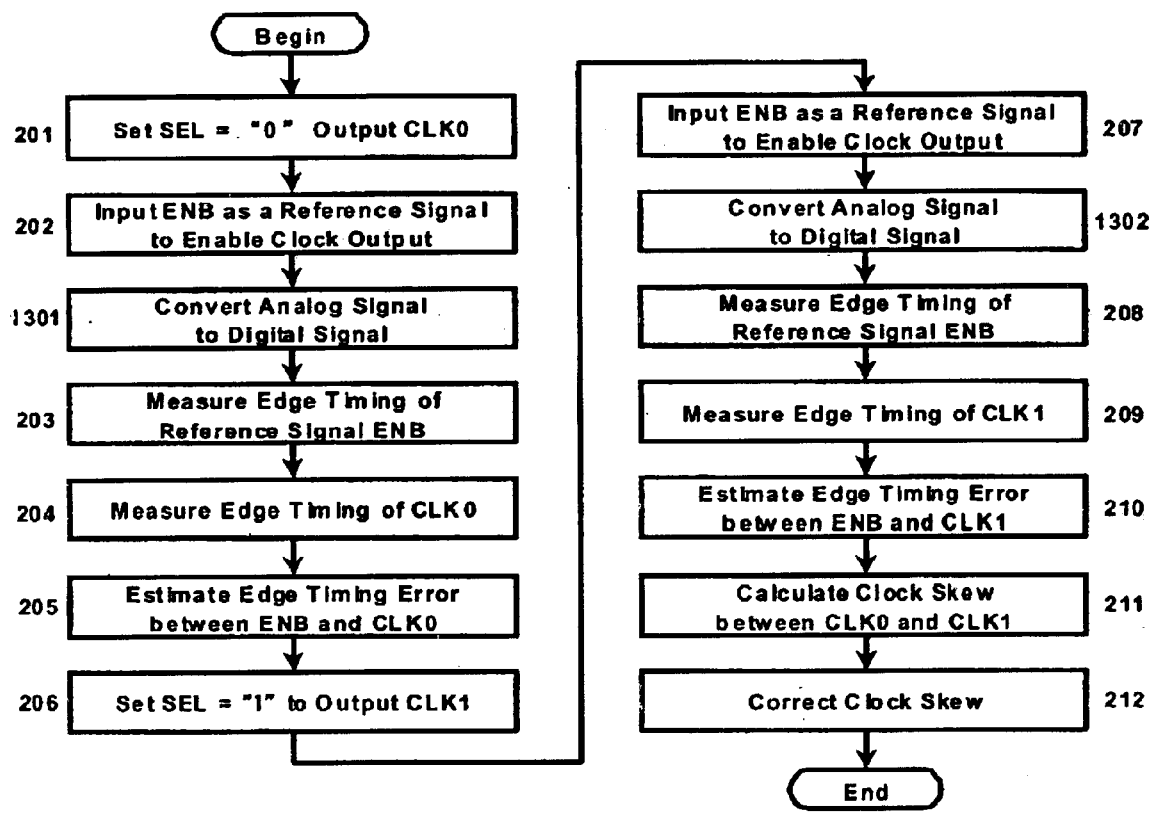
FIG. 37 is a flowchart of another exemplary clock skew measurement method of the present invention.

Next, a clock skew measuring operation of the clock skew measuring apparatus 1200 of the present embodiment is described. FIG. 37 shows another procedure of the clock skew measuring method of the present embodiment. This clock skew measuring method is the same as that shown in FIG. 26 except that Steps 1301 and 1302 are provided in which the analog reference signal and the analog signal to be measured are subjected to sampling (i.e., digitized) to be converted into the digital reference signal and the digital signal to be measured by the AD converters 1201*a* and 1201*b*. (For simplification, the description for the same steps as those shown in FIG. 26 is omitted.)

Figure 38:
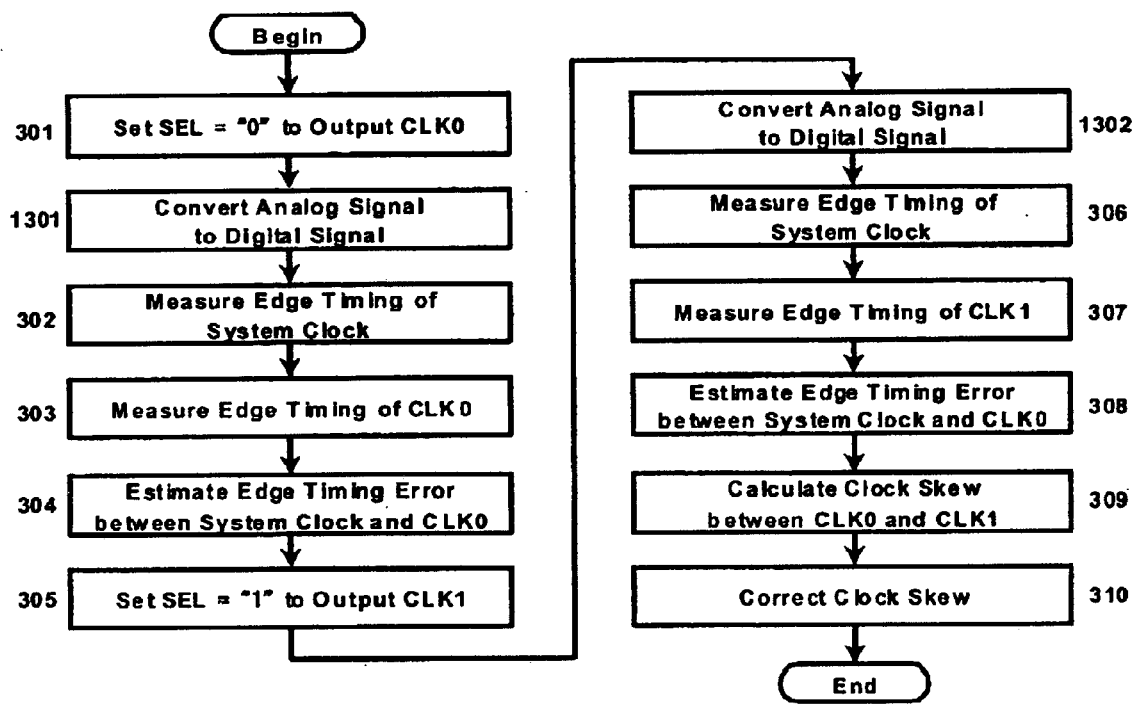
FIG. 38 is a flowchart of still another exemplary clock skew measurement method of the present invention.

The steps for respectively converting the analog signals to the digital signals may be included in the procedure of the clock skew measuring method shown in FIG. 27, as shown in FIG. 38.

Figure 39:
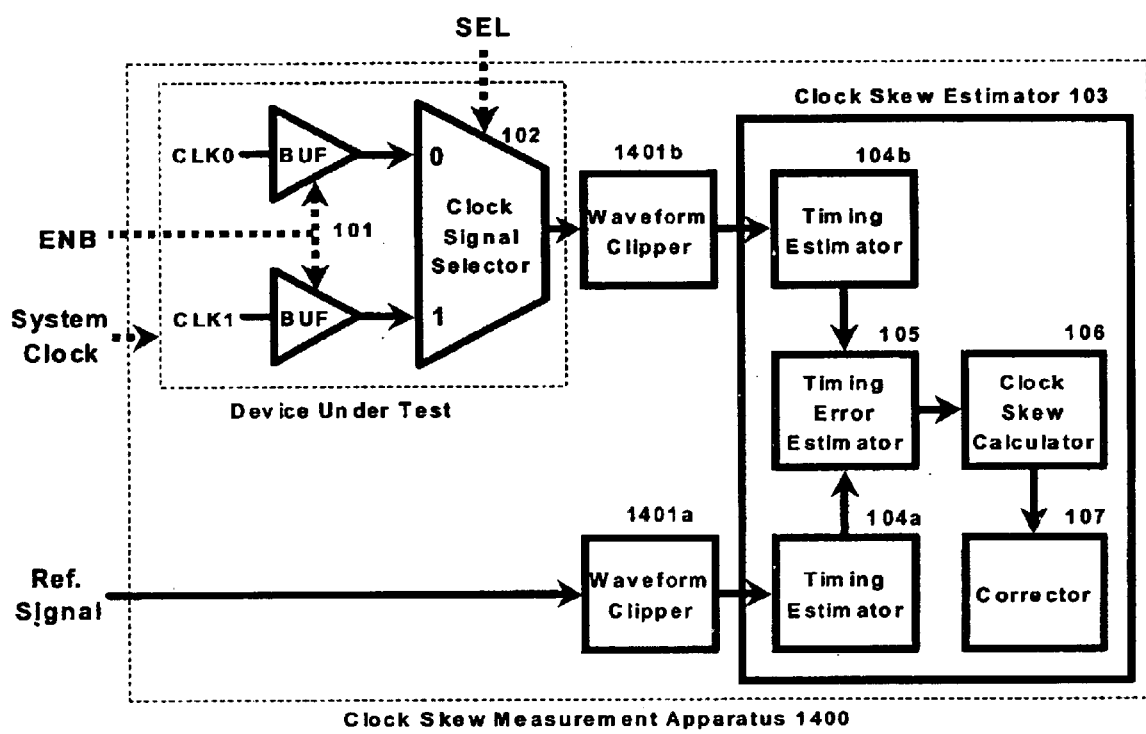
FIG. 39 shows still another exemplary structure of a clock skew measurement apparatus of the present invention.

FIG. 39 shows still another exemplary structure of the clock skew measuring apparatus of the present embodiment. The clock skew measuring apparatus 1400 has the same structure as that shown in FIG. 25 except that waveform clippers 1401*a* and 1401*b* are provided for removing the AM components of the signal. (For simplification, the description for the same components as those shown in FIG. 25 is omitted.)

Figure 40:
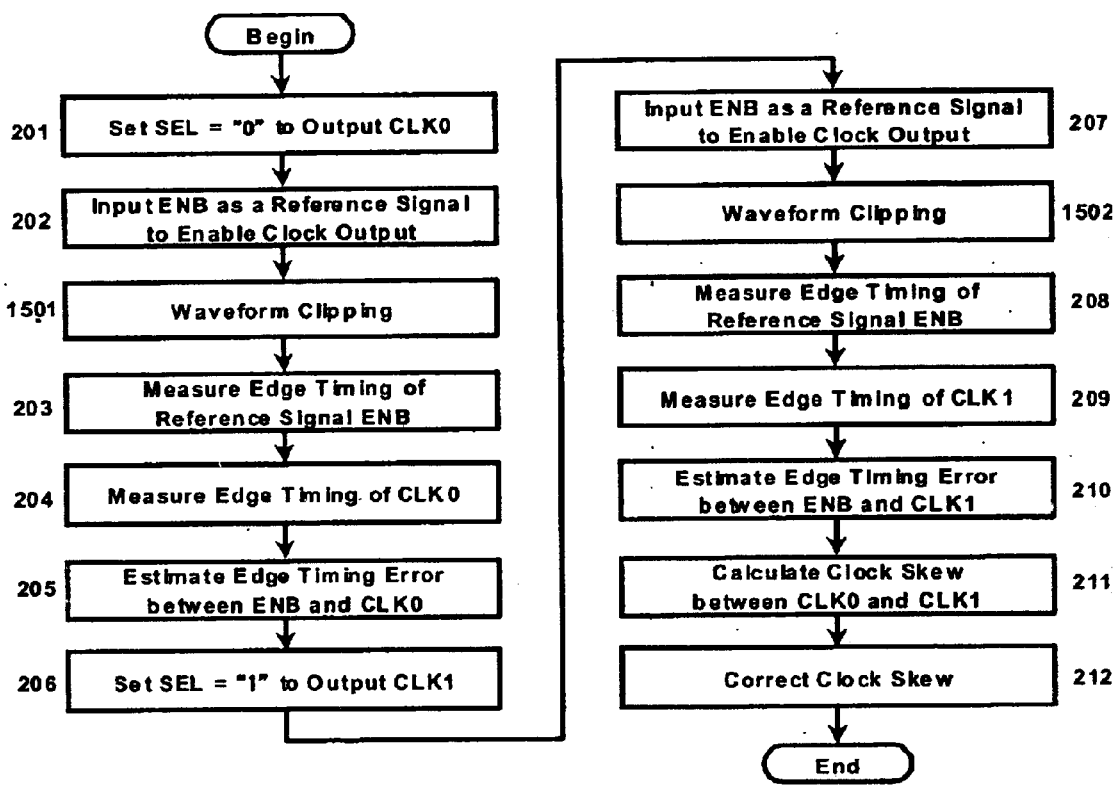
FIG. 40 is a flowchart of further another exemplary clock skew measurement method of the present invention.

Next, a clock skew measuring operation of the clock skew measuring apparatus 1400 of the present embodiment is described. FIG. 40 shows another procedure of the clock skew measuring method of the present embodiment. This clock skew measuring method is the same as the jitter measuring method shown in FIG. 26 except that Steps 1501 and 1502 are provided in which the waveform clippers 1401*a* and 1401*b* remove the AM components of the signal to be measured. (For simplification, the description for the same steps as those shown in FIG. 26 is omitted.)

Figure 41:
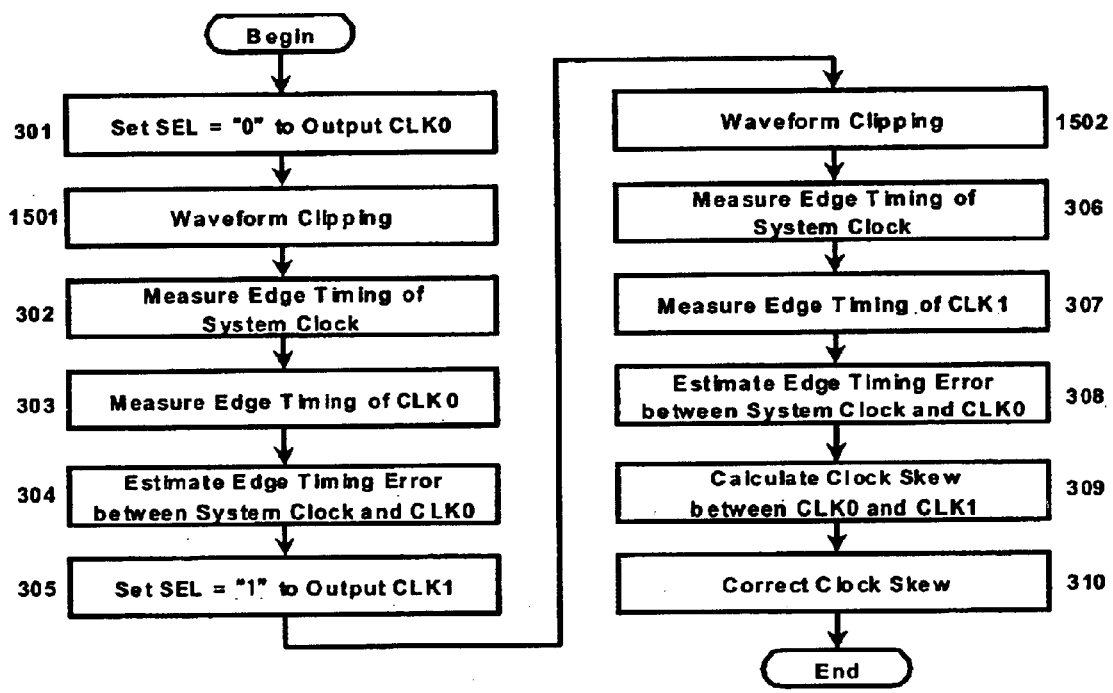
FIG. 41 is a flowchart of further another exemplary clock skew measurement method of the present invention.

The steps for removing the signal to be measured may be included in the procedure of the clock skew measuring method shown in FIG. 27, as shown in FIG. 41.

Figure 42:
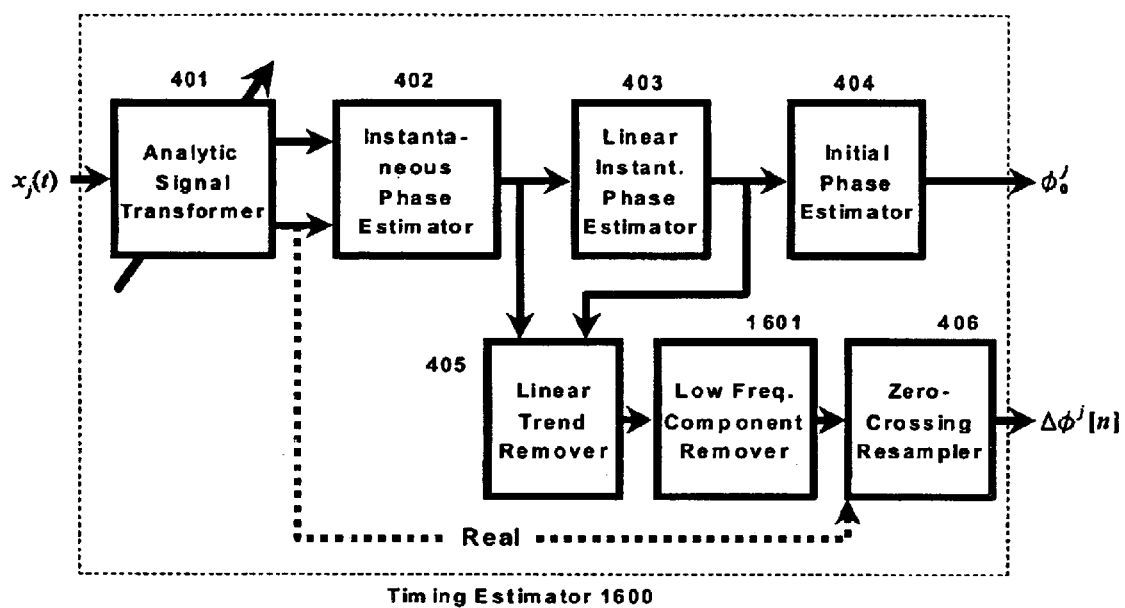
FIG. 42 shows another exemplary structure of a timing estimator included in the clock skew measurement apparatus of the present invention.

FIG. 42 shows another exemplary structure of the timing estimator of the present embodiment. The timing estimator 1600 has the same structure as that shown in FIG. 28 except that a low-frequency component remover 1601 is provided for inputting the instantaneous phase noise and removing low frequency components of the instantaneous phase noise so as to output the instantaneous phase noise after low frequency components have been removed to the zero-crossing resampler. (For simplification, the description for the same components as those shown in FIG. 28 is omitted.)

Figure 43:
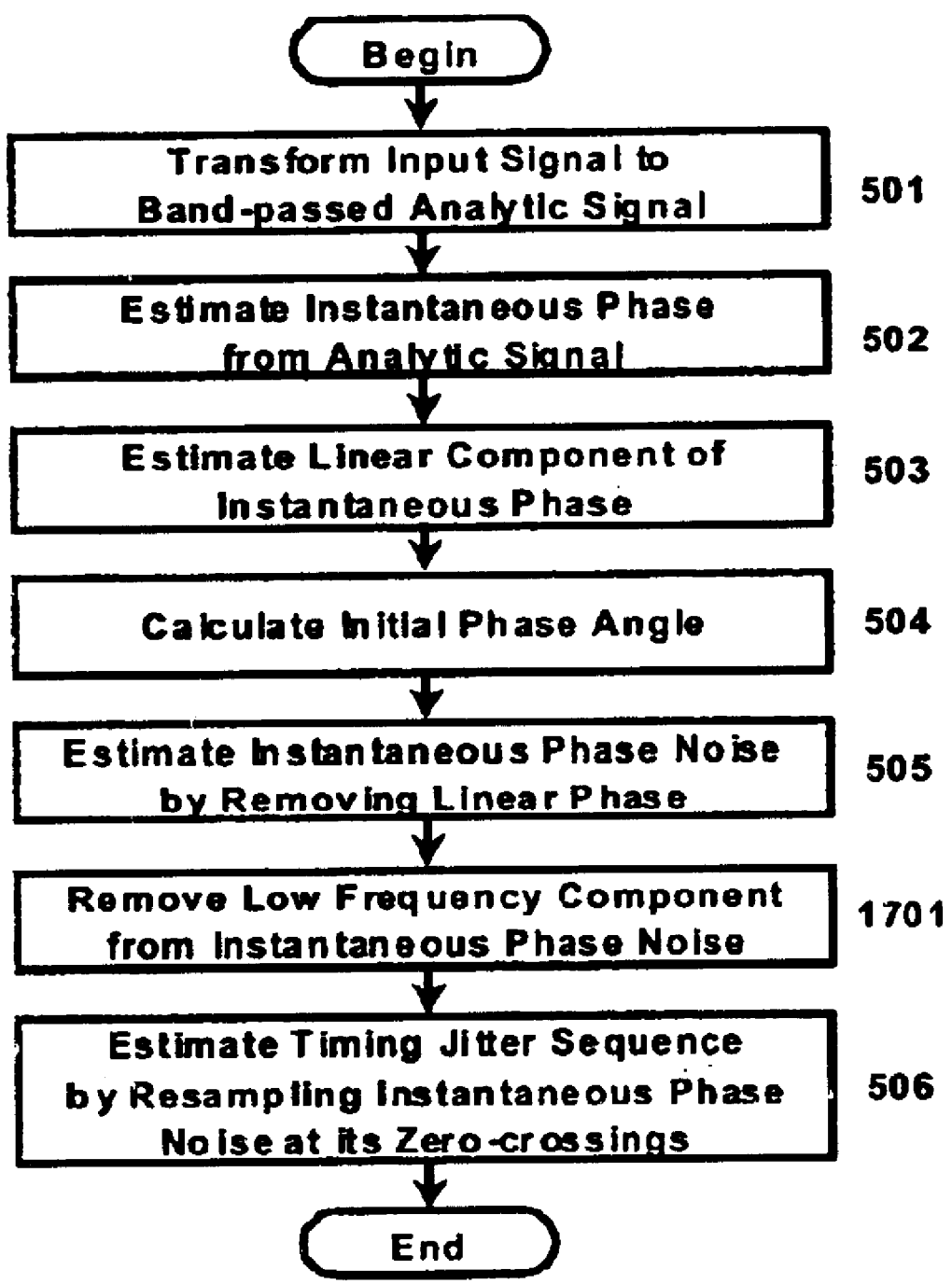
FIG. 43 is a flow chart of another exemplary timing estimation method included in the clock skew measurement method of the present invention.

Next, an operation of the timing estimator 1600 of the present embodiment for estimating the edge timing of the clock signal to be measured is described. FIG. 43 shows another procedure of the timing estimation of the present embodiment. This timing estimation is the same as that shown in FIG. 29 except that Step 1701 is provided for estimating the instantaneous phase noise and then removing the low frequency components of the instantaneous phase noise by means of the low-frequency component remover 1601. (For simplification, the description for the same steps as those shown in FIG. 29 is omitted.)

Figure 44:
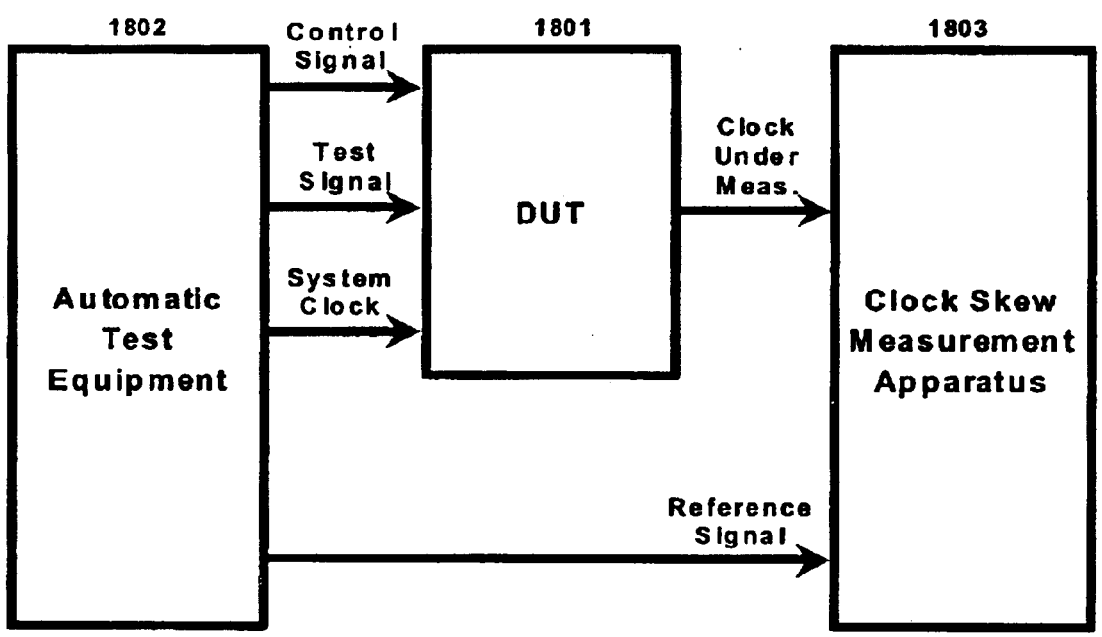
FIG. 44 shows an exemplary arrangement of a clock skew testing system using the clock skew measurement apparatus of the present invention.

FIG. 44 shows an exemplary arrangement of a clock skew testing system using the clock skew measuring apparatus of the present embodiment. The clock skew testing system 1800 includes automatic test equipment 1802 for supplying signals to a device under test (DUT) 1801, and the clock skew measuring apparatus 1803 for measuring the clock skews between the clock signals output from the device under test. The device under test has the clock signal selector for selecting and outputting the on-chip distributed clocks. The automatic test equipment 1802 supplies a low-frequency system clock for driving a clock distribution circuit, a control signal for controlling operation modes of the device under test 1801, and a test signal to the device under test 1801, and also supplies the reference signal to the clock skew measuring apparatus 1803. It is desirable that the system clock and the reference signal respectively supplied to the device under test 1801 and the clock skew measuring apparatus 1803 contain little jitter. The clock skew measuring apparatus 1803 may be incorporated into the automatic test equipment 1802 or be constructed by an oscilloscope or other measuring instrument.

As is apparent from the above, according to the clock skew measuring apparatus and method of the present invention, the number of high-frequency clock output pins that may increase the cost can be made minimum by providing the clock signal selector on the chip, thereby the cost of the clock skew test can be greatly reduced.

Although the present invention has been described by way of exemplary embodiments, it should be understood that many changes and substitutions may be made by those skilled in the art without departing from the spirit and the scope of the present invention which is defined only by the appended claims.

What is claimed is:

1. A clock skew measuring apparatus for measuring a clock skew between a plurality of clock signals to be measured in a circuit on which a test is performed, comprising:

a device under test having the circuit, comprising:

a clock signal selecting element operable to receive said plurality of clock signals to be measured from the circuit, said clock signal selecting element adapted as an output of said device under test for outputting said plurality of clock signals to be measured by selecting one of said plurality of clock signals to be measured one by one; and a clock skew estimator operable to receive a reference signal input to said device under test and said plurality of clock signals to be measured output from said clock signal selecting element and to obtain said clock skew between said plurality of clock signals to be measured by measuring a timing difference between said received reference signal and each of said plurality of clock signals to be measured.

2. A clock skew measuring apparatus as claimed in claim 1, wherein said clock skew estimator includes:
   a timing estimator operable to obtain a reference timing that is an edge timing of said reference signal and a tested timing that is an edge timing of each of said plurality of clock signals to be measured;
   a timing error estimator operable to obtain said timing difference between said tested timing and said reference timing; and
   a clock skew calculator operable to obtain said clock skew between said plurality of clock signals to be measured from said timing difference obtained for each of said plurality of clock signals to be measured.

3. A clock skew measuring apparatus as claimed in claim 2, wherein said timing estimator includes:
   an analytic signal transformer operable to transform each of said plurality of clock signals to be measured into a complex analytic signal;
   an instantaneous phase estimator operable to obtain an instantaneous phase of said analytic signal;
   a linear instantaneous phase estimator operable to obtain a linear instantaneous phase of each of said plurality of clock signals to be measured based on said instantaneous phase obtained; and
   an initial phase estimator operable to obtain an ideal edge timing of each of said plurality of clock signals to be measured by obtaining an initial phase angle of said linear instantaneous phase.

4. A clock skew measuring apparatus as claimed in claim 3, wherein said analytic signal transformer includes:
   a time-domain to frequency-domain transformer operable to receive each of said clock signals to be measured and to transform said received clock signal into two-sided spectra in a frequency domain;
   a bandwidth limiter operable to extract from said two-sided spectra frequency components around a positive fundamental frequency thereof; and
   a frequency-domain to time-domain transformer operable to inversely transform an output of said bandwidth limiter into a time-domain signal.

5. A clock skew measuring apparatus as claimed in claim 3, wherein said analytic signal transformer includes:
   a buffer memory, to which each of said plurality of clock signals to be measured is supplied, operable to store said supplied clock signal;
   an extracting portion operable to select and extract a section of said stored clock signal in such a manner that a section presently extracted partially overlaps a section previously extracted;
   a window function multiplier operable to multiply said extracted section by a window function;
   a transforming portion operable to transform said multiplied section into two-sided spectra in a frequency domain;
   a bandwidth limiter operable to extract, from said two-sided spectra transformed in said frequency domain, frequency components around a positive fundamental frequency of said supplied clock signal to be measured;
   an inverse transformer operable to inversely transforming an output of said bandwidth limiter into a time-domain signal; and
   an inverse window function multiplier operable to multiply said time-domain signal by a reciprocal of said window function to obtain said analytic signal that has been band-limited.

6. A clock skew measuring method for measuring a clock skew between a plurality of clock signals to be measured in a device under test, comprising:
   outputting said plurality of clock signals to be measured by selecting one of said plurality of clock signals to be measured one by one; and
   obtaining said clock skew between said plurality of clock signals to be measured by measuring a timing difference between reference signal input to said device under test and each of said plurality of clock signals to be measured one by one.

7. A clock skew measuring method as claimed in claim 6, wherein said reference signal is a system clock signal supplied to said device under test.

8. A clock skew measuring method as claimed in claim 6, wherein said outputting and selecting step includes determining which one of said plurality of clock signals is to be selected based on said reference signal.

9. A clock skew measuring method as claimed in claim 6, wherein said clock skew estimating step measures a deterministic component of said clock skew between said plurality of clock signals to be measured.

10. A clock skew measuring method as claimed in claim 6, wherein said clock skew estimating step measures a random component of said clock skew between said plurality of clock signals to be measured.

11. A clock skew measuring method as claimed in claim 6, wherein said clock skew estimating step includes:
    obtaining an edge timing of said reference signal as a reference timing;
    obtaining an edge timing of each of said plurality of clock signals to be measured as a tested timing;
    obtaining said timing difference between said tested timing and said reference timing; and
    obtaining said clock skew between said plurality of clock signals to be measured from said timing difference obtained for each of said plurality of clock signals to be measured.

12. A clock skew measuring method as claimed in claim 11, wherein said clock skew obtaining step further includes correcting said clock skew obtained from said timing difference.

13. A clock skew measuring method as claimed in claim 11, wherein said obtaining of edge timing obtains a rising edge timing or a falling edge timing of each of said reference signal and said plurality of clock signals to be measured.

14. A clock skew measuring method as claimed in claim 11, wherein said timing estimating includes:
    transforming each of said plurality of clock signals to be measured into a complex analytic signal;
    obtaining an instantaneous phase of said analytic signal;
    obtaining a linear instantaneous phase of each of said plurality of clock signals to be measured based on said instantaneous phase obtained; and
    obtaining an ideal edge timing of each of said plurality of clock signals to be measured by obtaining an initial phase angle of said linear instantaneous phase.

15. A clock skew measuring method as claimed in claim 14, wherein said obtaining of edge timing includes:
    removing said linear instantaneous phase from said instantaneous phase to obtain an instantaneous phase noise; and
    re-sampling only data of said instantaneous phase noise around zero-crossing timings of a real part of said analytic signal to output a timing jitter sequence of each of said plurality of clock signals to be measured.

16. A clock skew measuring method as claimed in claim 15, wherein said obtaining of said edge timing further includes removing low frequency components of said instantaneous phase noise.

17. A clock skew measuring method as claimed in claim 14, wherein said transformation into said complex analytic signal includes:
    extracting, from each of said plurality of clock signals to be measured, frequency components around a fundamental frequency of said clock signal to output a band-limited signal; and
    performing Hilbert transformation for said band-limited signal to generate Hilbert transform pairs of said clock signal.

18. A clock skew measuring method as claimed in claim 14, wherein said transformation into said complex analytic signal includes:
    transforming each of said plurality of clock signals to be measured into two-sided spectra in a frequency domain;
    extracting, from said two-sided spectra, frequency components around a positive fundamental frequency thereof; and
    inversely transforming said two-sided spectra that has been band-limited into a time-domain signal.

19. A clock skew measuring method as claimed in claim 14, wherein said transformation into said complex analytic signal includes:
    storing each of said clock signals to be measured;
    selecting and extracting a section of said stored clock signal in such a manner that a section presently extracted partially overlaps a section previously extracted;
    multiplying said extracted section by a window function;
    transforming said multiplied section into two-sided spectra in a frequency domain;
    extracting, from said two-sided spectra transformed in said frequency domain, frequency components around a positive fundamental frequency of said stored clock signal to be measured;
    inversely transforming said spectra that has been band-limited into a time-domain signal; and
    multiplying said time-domain signal by a reciprocal of said window function to obtain said analytic signal that has been band-limited.

20. A clock skew measuring method as claimed in claim 11, wherein obtaining of said timing difference between said tested timing and said reference timing includes:
    calculating a plurality of timing differences from said tested timing and said reference timing for each of said plurality of clock signals; and
    obtaining a mean value of said plurality of timing differences, and
    wherein said clock skew obtaining obtains said clock skew between said plurality of clock signals to be measured based on said mean value of said plurality of timing differences.

21. A clock skew measuring method as claimed in claim 6, wherein said clock skew obtaining removes amplitude modulation components from said reference signal and each of said plurality of clock signals to be measured to extract phase modulation components thereof.

* * * * *